United States Patent
Liu et al.

(10) Patent No.: US 11,249,155 B2
(45) Date of Patent: Feb. 15, 2022

(54) RF TRANSMIT SYSTEM AND METHOD, MRI SYSTEM AND PRE-SCAN METHOD AND STORAGE MEDIUM THEREOF

(71) Applicant: GE Precision Healthcare LLC, Wauwatosa, WI (US)

(72) Inventors: Yu Liu, Beijing (CN); Tingting Song, Beijing (CN); Haoyang Xing, Beijing (CN); Xin Xie, Beijing (CN); Dongliang Yang, Beijing (CN); Chunlai Xiao, Beijing (CN); Xianchao Wu, Beijing (CN)

(73) Assignee: GE Precision Healthcare LLC, Wauwatosa, WI (US)

( * ) Notice: Subject to any disclaimer, the term of this patent is extended or adjusted under 35 U.S.C. 154(b) by 0 days.

(21) Appl. No.: 16/928,139

(22) Filed: Jul. 14, 2020

(65) Prior Publication Data

US 2021/0025953 A1    Jan. 28, 2021

(30) Foreign Application Priority Data

Jul. 24, 2019 (CN) .......................... 201910671182.8

(51) Int. Cl.
 *G01R 33/36* (2006.01)
(52) U.S. Cl.
 CPC ..... *G01R 33/3621* (2013.01); *G01R 33/3614* (2013.01)

(58) Field of Classification Search
 CPC .................. G01R 33/3621; G01R 33/3614
 See application file for complete search history.

(56) References Cited

U.S. PATENT DOCUMENTS

| 5,424,646 A * | 6/1995 | Hoshino | G01R 33/3614 324/318 |
| 7,642,850 B2 | 1/2010 | Martin | |
| 9,294,046 B2 | 3/2016 | Scott | |
| 2016/0003925 A1 * | 1/2016 | Nakamura | G01R 33/5659 324/322 |
| 2016/0033609 A1 * | 2/2016 | Yamanaka | G01R 33/5659 324/322 |

* cited by examiner

*Primary Examiner* — G. M. A Hyder

(57) ABSTRACT

The present invention relates to an RF transmit system and method, MRI system and a pre-scan method and medium thereof. The RF transmit system comprises: an RF output unit, for generating and outputting an RF pulse signal; an RF amplifier, for amplifying the RF pulse signal; and a signal processing unit, for communicating the amplified RF pulse signal to an RF transmit coil of the MRI system and outputting a feedback signal to the RF output unit, wherein the RF output unit generates a linearity compensation control signal based on the feedback signal and a predetermined feedback signal-linearity compensation value-relationship, so as to carry out linearity compensation for the RF pulse signal outputted by the RF output unit. The RF transmit method corresponds to the above noted system and the MRI system comprises the above noted RF transmit system. The pre-scan method comprises the RF transmit method. Instructions recorded by the medium may execute the above noted RF transmit method and pre-scan method.

18 Claims, 15 Drawing Sheets

RF TRANSMIT SYSTEM AND METHOD, MRI SYSTEM AND PRE-SCAN METHOD AND STORAGE MEDIUM THEREOF

CROSS-REFERENCE TO RELATED APPLICATIONS

This application claims the benefit of Chinese Patent Application No. 201910671182.8 filed on Jul. 24, 2019, the disclosure of which is herein incorporated by reference in its entirety.

TECHNICAL FIELD

The present invention generally relates to the medical imaging filed, and in particular, relates to a magnetic resonance imaging (MRI) system, a radio frequency (RF) system and method used for MRI, and a pre-scan method for an MRI system. The present invention further relates to a computer readable storage medium recorded with the instructions that can automatically execute the above noted method.

BACKGROUND

MRI systems have been widely used in the field of medical diagnostics. An MRI system mainly comprises a primary magnet, a gradient amplifier, a gradient coil assembly, an RF transmit chain module, an RF coil assembly, an RF receiving chain module and the like. The RF transmit chain module therein typically comprises an RF output unit, a signal processing unit, and a transmit coil. FIG. 14 illustrates a conventional transmit chain configuration in an MRI system, where RF pulse signals are generated by an RF generator and communicated to a signal processing unit after amplifying by an RF amplifier. The signal processing unit is generally integrated with a switch for switching between a receiving mode and a transmit mode and an electric bridge with paths I/Q; and such signal processing unit communicates the signal outputted from the RF amplifier to a transmit coil in a transmission mode. The transmit coil may be a body coil as shown in FIG. 14, or a local coil that receives the RF pulse signal communicated from the signal processing unit, so as to transmit RF excitation pulses to the object to be scanned (e.g., a patient).

In the process of the above noted RF signal amplification, the non-linearity of a gain and a phase of an RF amplifier may be introduced into an entire MRI system, thereby causing distortion of an ultimately obtained image. In order to avoid these problems, it is necessary to attach particular importance to the linearity of the entire RF transmit chain, as it plays a crucial role in the selection of sliced images and obtaining high-quality images.

In the past, in order to achieve a better linearity of the RF transmit chain, the efficiency of the RF amplifier often needs to be sacrificed, as such non-linearity is precisely caused by, for example, the RF amplifiers with tens of kilowatts of high power. Thus, a compromise must be made with respect to the operational type of RF amplifiers commonly used—between efficiency and linearity. However, even so, such a solution is not very ideal, as often RF amplifiers with good linearity are inefficient, while RF amplifiers with high efficiency are of poor linearity. Therefore, additional linearity compensation methods are also required to compensate for the non-linearity generated by the RF amplifier.

A variety of linearity compensation methods in the prior art are able to improve the linearity of the RF amplifier. However, it is difficult for these compensation methods to achieve a satisfactory linearity in an actual application of MRI. Therefore, there is an urgent need for a novel linearity compensation technique that can solve all of the above problems.

SUMMARY

The objective of the present invention is to overcome the above and/or other problems in the prior art.

To this end, the present invention has provided a novel RF transmit system and method that can effectively compensate for a non-linearity of an RF amplifier and is completely suitable for a clinical application of MRI.

Meanwhile, the present invention has further provided an MRI system which comprises the novel RF transmit system as described above, thus achieving a more precise gain/phase compensation compared with the prior art and thereby obtaining optimal image quality.

In addition, the present invention has further provided a pre-scan method used for an MRI system that compensates an RF pulse signal through executing the RF transmit method as described above, so that fidelity can be ensured for different patient loads, thereby ensuring final image quality.

The present invention has further provided a computer-readable storage medium having instructions recorded thereon that can execute the RF transmit method and pre-scan method as described above.

According to the first aspect of the present invention, an RF transmit system of an MRI system is provided, comprising: an RF output unit, for generating and outputting an RF pulse signal; an RF amplifier, for amplifying the RF pulse signal; and a signal processing unit, for communicating the amplified RF pulse signal to the RF transmit coil of the MRI system and outputting a feedback signal to the RF output unit, wherein the RF output unit generates a linearity compensation control signal based on the feedback signal and a predetermined feedback signal-linearity compensation value-relationship, so as to carry out linearity compensation for the RF pulse signal outputted by the RF output unit.

Preferably, the feedback signal comprises a forward feedback signal communicated to the RF transmit coil by the signal processing unit, wherein the RF output unit determines a linearity compensation value corresponding to the forward feedback signal based on the predetermined feedback-signal-linearity compensation value-relationship and generates a linearity compensation control signal based on the determined signal-linearity compensation value.

Preferably, the feedback signal comprises the forward feedback signal communicated to the RF transmit coil by the signal processing unit and a reverse feedback signal fed back from the RF transmit coil to the signal processing unit and outputted by such signal processing unit; and the predetermined feedback signal-linearity compensation value-relationship comprises a feedback signal-linearity compensation value-relationship generated under the corresponding load characteristics; the RF output unit is configured to: decide current load characteristics of the RF transmit coil based on the reverse feedback signal and determine whether a feedback signal-linearity compensation value-relationship corresponding to the current load characteristics exists; and if no feedback signal-linearity compensation value-relationship corresponding to the current load characteristics exists, then generate a new feedback signal-linearity compensation value-relationship under the current load characteristics; and determine a linearity compensation value corresponding to the forward feedback signal based on the feedback signal-linearity compensation value-relationship corresponding to the current load characteristics if a feedback signal-linearity compensation value-relationship corresponding to the current load characteristics exists; and generate the linearity compensation control signal based on the determined linearity compensation value.

Further, the RF pulse signal outputted by the RF output unit comprises a group of pulse signals having a central frequency generated according to a preset sequence; the group of pulse signals have different amplitudes; and the central frequency is a central frequency of an RF excitation pulse adopted when the MRI system carries out scanning with respect to the current load.

If no feedback signal-linearity compensation value-relationship corresponding to the current load characteristics exists, then the RF output unit is further configured to: calculate open-loop characteristics of the RF output unit and the RF amplifier under the current load characteristics, based on the forward feedback signal and generate a feedback signal-linearity compensation value-relationship corresponding to the current load characteristics, based on the open-loop characteristics.

Preferably, the amplitude variation of the applied group of pulse signals is greater than 40 dB and the phase thereof remains constant.

If a feedback signal-linearity compensation value-relationship corresponding to the current load characteristics exists, then the RF output unit is further configured to: determine a priority feedback signal-linearity compensation value-relationship for recommendation, based on a predetermined deep learning network and according to the current load characteristics.

Preferably, the RF transmit system further comprises a memory, for storing the predetermined feedback signal-linearity compensation value-relationship.

According to the second aspect of the present invention, an MRI system is provided, comprising an RF transmit coil and the RF transmit system as described above.

According to the third aspect of the present invention, an RF transmit method for an MRI system is provided, comprising the following steps: generating and outputting an RF pulse signal by an RF output unit; amplifying the RF pulse signal by an RF amplifier; communicating the amplified RF pulse signal to an RF transmit coil of the MRI system by a signal processing unit and outputting the feedback signal to the RF output unit; and generating a linearity compensation control signal based on the feedback signal and a predetermined feedback signal-linearity compensation value-relationship outputted by the RF output unit, so as to carry out linearity compensation for the RF pulse signal outputted by the RF output unit.

Preferably, the feedback signal comprises the forward feedback signal communicated to the RF transmit coil by the signal processing unit and a reverse feedback signal fed back from the RF transmit coil to the signal processing unit and outputted by such signal processing unit; and the predetermined feedback signal-linearity compensation value-relationship comprises a feedback signal-linearity compensation value-relationship generated under the corresponding load characteristics. The above noted step for generating a linearity compensation control signal further comprises the following sub-steps: determining current load characteristics of the RF transmit coil based on the reverse feedback signal, and determining whether a feedback signal-linearity compensation value-relationship corresponding to the current load characteristics exists; if no feedback signal-linearity compensation value-relationship corresponding to the current load characteristics exists, then generating a new feedback signal-linearity compensation value-relationship under the current load characteristics; determining a linearity compensation value corresponding to the forward feedback signal based on the feedback signal-linearity compensation value-relationship corresponding to the current load characteristics if a feedback signal-linearity compensation value-relationship corresponding to the current load characteristics exists; and generating the linearity compensation control signal based on the determined linearity compensation value.

Further, the RF pulse signal outputted by the RF output unit comprises a group of pulse signals having a central frequency generated according to a preset sequence; the group of pulse signals have different amplitudes; and the central frequency is a central frequency of an RF excitation pulse adopted when the MRI system carries out scanning with respect to the current load.

Further, the step of generating a new feedback signal-linearity compensation value-relationship under the current load characteristics comprises: calculating open-loop characteristics of the RF output unit and the RF amplifier under the current load characteristics, based on the forward feedback signal; and generating a feedback signal-linearity compensation value-relationship corresponding to the current load characteristics, based on the open-loop characteristics.

Preferably, the amplitude variation of the applied group of pulse signals is greater than 40 dB and the phase thereof remains constant.

If a feedback signal-linearity compensation value-relationship corresponding to the current load characteristics exists, then the above noted step of generating a linearity compensation control signal further comprises the following sub-step: determining a priority feedback signal-linearity compensation value-relationship for recommendation, based on a predetermined deep learning network and according to the current load characteristics.

According to the fourth aspect of the present invention, a pre-scan method for an MRI system is provided, comprising: receiving a central frequency for pre-scan predetermined by the MRI system; generating a linearity compensated RF pulse signal through executing the above noted RF transmit method, wherein the compensated RF pulse signal has the central frequency; and outputting a linearity compensated RF pulse signal which is communicated to the RF transmit coil after amplification, so as to cause the RF transmit coil to generate an RF field for exciting a load serving as a scanned object.

According to the fifth aspect of the present invention, a computer-readable storage medium is provided, having coded instructions recorded thereon and when such instructions are executed, the RF transmit method and pre-scan method as described above can be executed.

Other features and aspects will become clear through the following detailed description, accompanying drawings and claims.

BRIEF DESCRIPTION OF THE DRAWINGS

The present invention may be better understood by describing exemplary embodiments of the present invention with reference to accompanying drawings, in which.

DETAILED DESCRIPTION

Specific implementation manners of the present invention will be described in the following. It should be noted that during the specific description of the implementation manners, it is impossible to describe all features of the actual implementation manners in detail in this description for the sake of brief description. It should be understood that in the actual implementation of any of the implementation manners, as in the process of any engineering project or design project, a variety of specific decisions are often made in order to achieve the developer's specific objectives and meet system-related or business-related restrictions, which will vary from one implementation manner to another. Moreover, it can also be understood that even if efforts made in such development process are complex and lengthy, for those of ordinary skill in the art of the content disclosed in the present invention, some changes in design, manufacturing, production or the like based on the technical content disclosed in the present disclosure are only conventional technical means and should not be construed as that the content of the present disclosure is insufficient.

Unless otherwise defined, the technical or scientific terms used in the claims and the description are as they are usually understood by those of ordinary skill in the art to which the present invention pertains. The words "first," "second" and similar words used in the description and claims of the patent application of the present invention do not denote any order, quantity or importance, but are merely intended to distinguish between different constituents. "One," "a" and similar words are not meant to be limiting, but rather denote the presence of at least one. The word "include," "comprise" or a similar word is intended to mean that an element or article that appears before "include" or "comprise" encompasses an element or article and equivalent elements that are listed after "include" or "comprise," and does not exclude other elements or articles. The word "connect," "connected" or a similar word is not limited to a physical or mechanical connection and is not limited to a direct or indirect connection.

First Embodiment

According to an embodiment of the present invention, an RF transmit system is provided.

Figure 1:
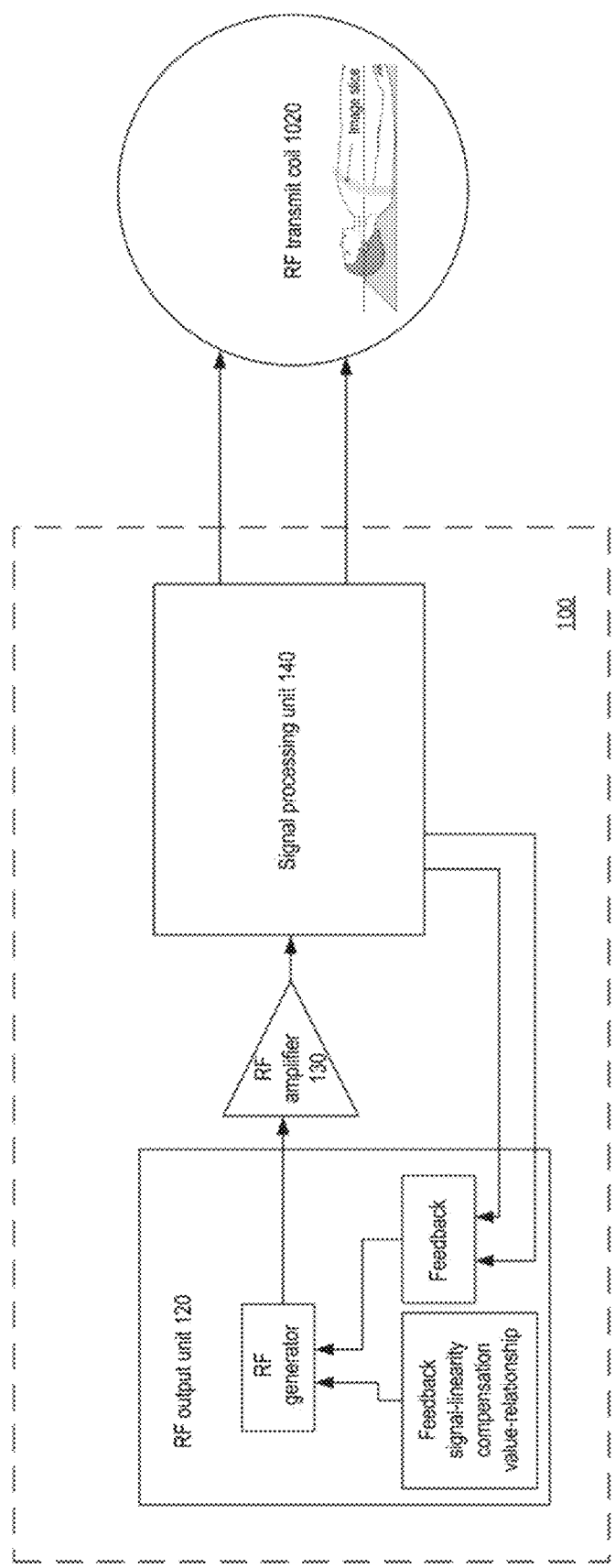
FIG. 1 is a schematic block diagram of an RF transmit system according to an illustrative embodiment of the present invention.

Referring to FIG. 1, an RF transmit system 100 according to an illustrative embodiment of the present invention is shown. The RF transmit system comprises an RF output unit 120, an RF amplifier 130 and a signal processing unit 140. The RF output unit 120 is used for generating an RF pulse signal and the RF amplifier is used for amplifying an RF pulse signal generated by the RF output unit 120. The signal processing unit 140 is used for communicating the amplified RF pulse signal to an RF transmit coil 1020 in an MRI system (which will be described in detail below) and outputting a feedback signal to the RF output unit 120. After the RF transmit coil 1020 receives the RF pulse signal communicated from the signal processing unit 140, an RF excitation signal is transmitted to an object to be scanned (a human body in FIG. 1) 1016.

As illustrated in FIG. 1, the RF output unit 120 generates a linearity compensation control signal based on the feedback signal from the signal processing unit 140 and a feedback signal-linearity compensation value-relationship (i.e., the relationship between the feedback signal and a linearity compensation value), to carry out linearity compensation with respect to the RF excitation pulse outputted by the RF output unit 120, such as causing the RF output unit 120 to output a linearity compensated RF excitation pulse. The above linearity compensation value may be a compensation value with respect to a gain or a phase. Those skilled in the art should appreciate that the relationship between the feedback signal and the linearity compensation value can be represented in a variety of forms. For example, the linearity compensation value therein may comprise intermediate data or conversion data capable of reflecting the compensation value.

The above noted relationship between the feedback signal and (gain or phase) linearity compensation values may be represented by a lookup table which may be a one to one correspondence between a group of predetermined forward-feeding linearity compensation values (including gain compensation values and phase compensation values) and a group of characteristic values (such as the voltage, current, or power). In particular, it may be shown in Table 1 below, where a signal characteristic value index therein may be an orderly arranged group of index values that may sequentially point to decremental or incremental power characteristic values, such as an ideal amplitude of a power signal. The ideal amplitude may comprise an amplitude of an RF pulse that needs to be applied to an RF transmit coil determined by a scan sequence when executing a pre-scan or a formal scan by an MRI system. The lookup table values in Table 1 may be directed directly to the linearity compensation values of the gain or the phase, i.e., having a fixed linearity compensation value for each power characteristic value.

TABLE 1

| Signal characteristic value index | Lookup table values |
|---|---|
| Index 255 | Value 1 |
| Index 383 | Value 2 |
| Index 511 | Value 3 |
| ... | ... |

The above noted power characteristic value may also be an ideal phase of the power signal.

After receiving the feedback signal from the signal processing unit 140, it may be possible to look for the same characteristic value as the feedback signal (e.g., a power signal) in the lookup table as shown in Table 1 above.

Alternatively, in the absence of the same characteristic value, a characteristic value that is closest to such feedback signal is looked up (e.g., looking for the same or the closest power amplitude in Table 1); next, a linearity compensation value corresponding to the characteristic value that has been looked up is selected. Alternatively, the linearity compensation value corresponding to the feedback signal is calculated through interpolation calculation, based on the linearity compensation value corresponding to the characteristic value close to the feedback signal in the lookup table as shown in Table 1 above. Finally, a linearity compensation control signal is generated based on the linearity compensation value, to carry out linearity compensation with respect to the gain or phase of the output of the RF output unit 120, for example, to carry out linearity compensation with respect to the RF excitation pulses to be outputted by the RF output unit 120.

Figure 2:
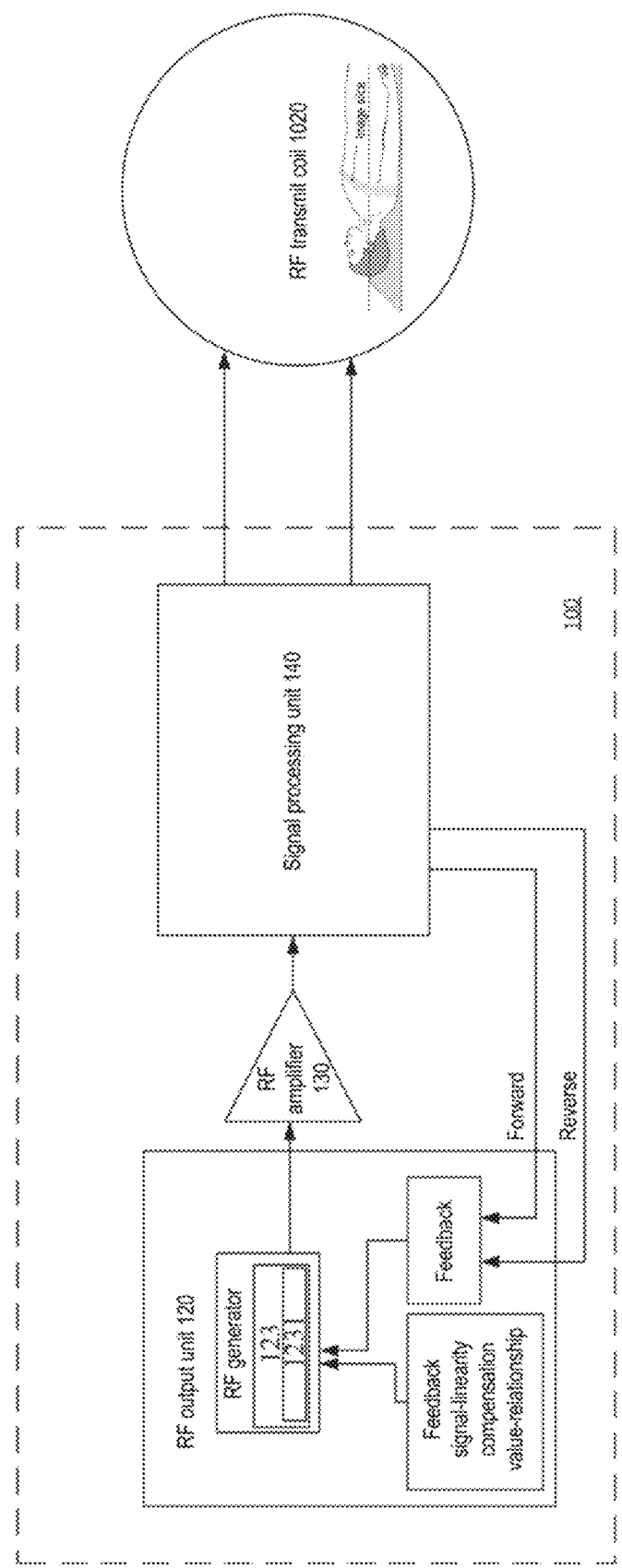
FIG. 2 is a schematic block diagram of an RF transmit system according to an illustrative embodiment of the present invention.

With further reference to FIG. 2, an example of the RF transmit system of FIG. 1 is shown and the above noted linearity compensation may specifically comprise, for example, controlling the output of a transmit attenuator 1231 disposed in an RF front-end circuit 123 based on the linearity compensation control signal, or adjusting the output value of the RF generator.

Thus, for example, control parameters that require linearity compensation (e.g., an attenuation coefficient outputted by the transmit attenuator as described above) may be quickly determined through utilizing the predetermined correspondence e.g., between the signal characteristic value of the power signal (in one embodiment, it may also be represented by the amplitude or the conversion value of the amplitude that can reflect the power signal) and the gain or the phase that require compensation, so that the linearity of the entire RF transmit chain can be very effectively compensated. As the generated RF excitation pulse is amplified and outputted to the RF transmit coil 1020, after being through linearity compensation, the image quality problem caused by the poor linearity of the transmit chain can be greatly reduced.

Continuing to refer to FIG. 2, for example, a total of two feedback signals are outputted from the signal processing unit 140, with one being a forward feedback signal output directly from the signal processing unit 140, i.e., the feedback signal located at the front-end of the RF transit coil in the entire transmit chain (communicating from the signal processing unit 140 to the RF transmit coil 1020), and the other being the reverse feedback signal that returns from the RF transmit oil 1020 and that is outputted through the signal processing unit 140 after the RF pulse signal is amplified and reaches the RF transmit coil 1020 through the signal processing unit 140, i.e., the feedback signal located at the rear-end of the RF transit coil in the entire transmit chain. It should be noted that, the signal processing unit 140 communicates the signal to the RF transmit coil 1020 via the two paths of I and Q and the above noted reverse feedback signal is zero. When the RF transmit coils 1020 are very symmetrical so that the resistances (amplitude and phase) of the above noted I and Q two paths are the same, then the feedback signal of the signal processing unit 140 is the forward feedback signal output directly from the signal processing unit 140.

The signal processing unit 140 may comprise a switch for switching between a transmit mode and a receiving mode and an electrical bridge for distributing RF pulse signals to I and Q paths in a transmission mode.

Figure 3:
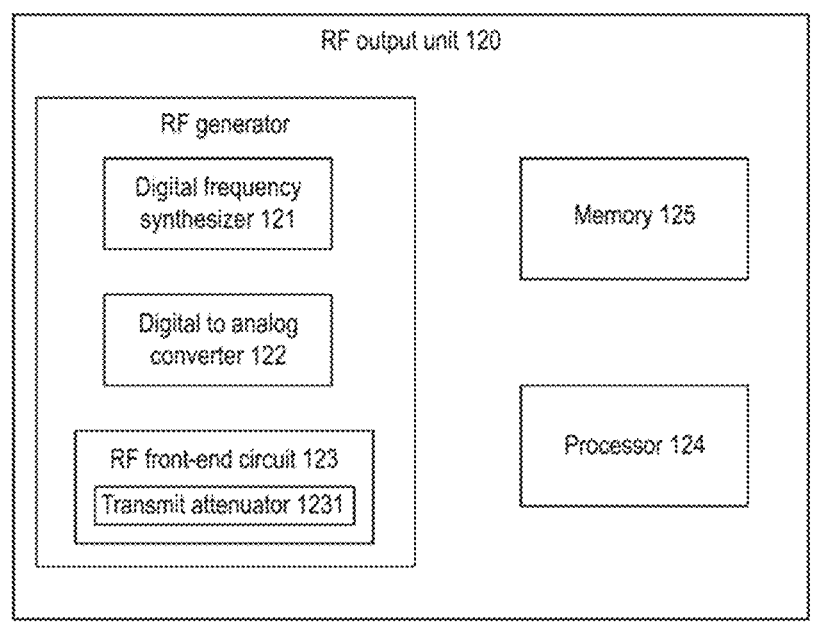
FIG. 3 is a schematic block diagram of an RF output unit in the RF transmit system as shown in FIG. 1 and FIG. 2.

As shown in FIG. 3, in one embodiment, the RF output unit 120 may comprise an RF generator which may comprise a digital frequency synthesizer 121, a digital analog converter 122 and an RF front-end circuit 123. As previously described, the RF generator is used to generate an RF pulse signal that is applied to the RF transmit coil 1020 during MRI scan to excite the site to be imaged of the object (e.g., a patient) to be scanned. The RF front-end circuit 123 may further comprise the above noted transmit attenuator 1231 that connects to the RF amplifier 130 to control the attenuation degree of the signal before being input to the RF amplifier 130.

Figure 15:
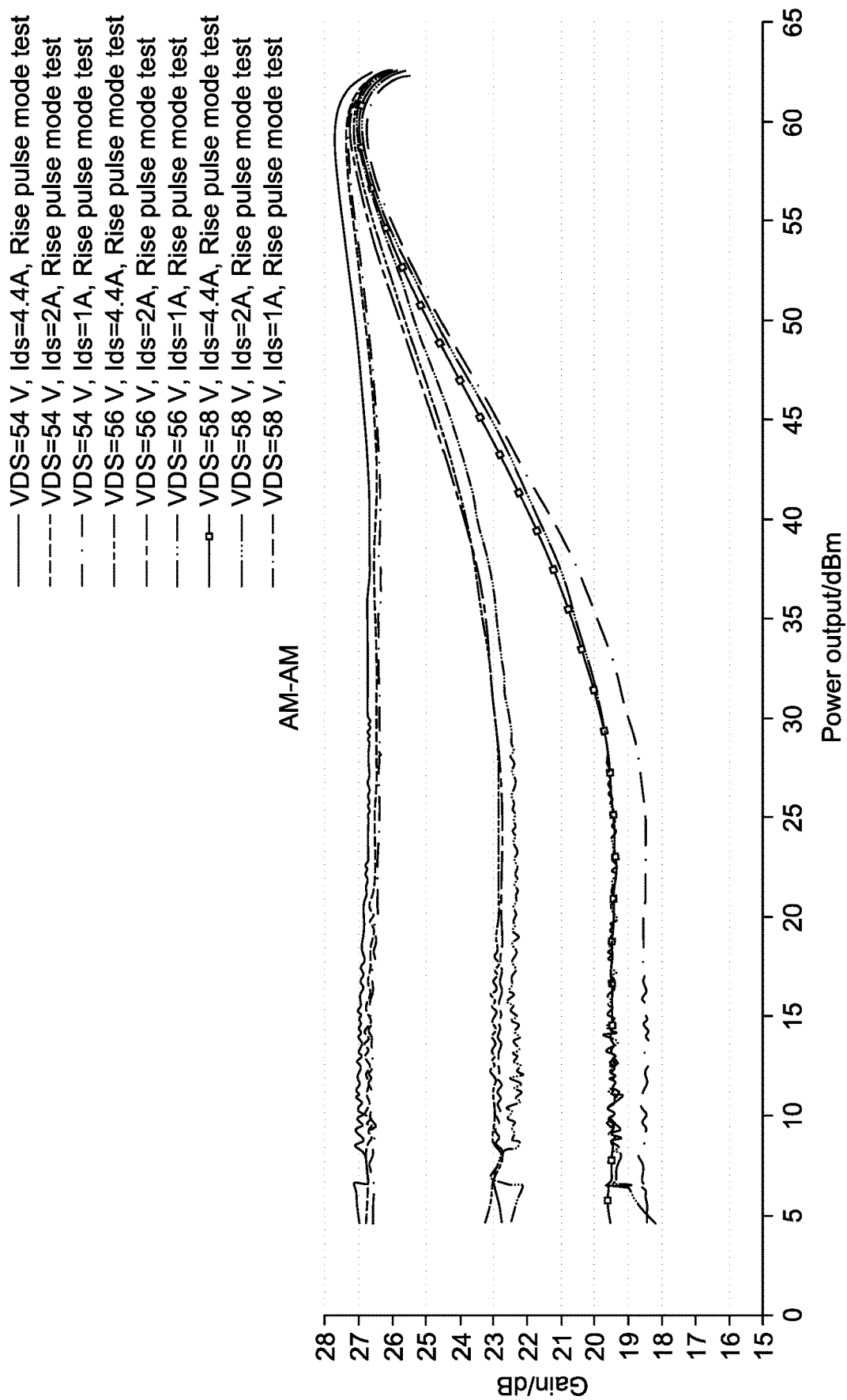
FIG. 15 illustrates a linearity performance of a conventional RF amplifier.

The RF amplifiers can generally be classified into categories A, B, C, D, E, F, etc., according to operational types. Since the RF amplifiers of operational types such as D, E, F, etc., are almost equivalent to switch-type amplifiers, their linearity is the least ideal for MRI applications. Thus, RF amplifiers of operational types as Category A or Category B or Category AB (a compromise of Category A and Category B) are commonly used. The curves in the upper and middle portions in FIG. 15 have respectively shown the linearity performance of RF amplifiers of operational types of Category A and Category AB, where VDS represents the drain source voltage and Ids represents the drain source current. As can be seen from FIG. 15, Category A RF amplifiers have the best linearity; however, their efficiency is not ideal, which is less than or equal to 50%. Although the efficiency of Category B RF amplifiers has been greatly improved compared with Category A and the efficiency of 78.5% may be theoretically achieved, from FIG. 15 (the curve in the lower portion) it is known that, their linearity has deteriorated. The requirement for linearity in the MRI field is very high and the gain deviation is required to be less than +/−0.4 dB and the phase deviation is required to be less than +/−3 deg in the range of 40 dB down from the rated peak power and thus, it is clear that a simple Category AB RF amplifier is obviously not ideal.

With the RF transmit system 100 of the present invention, when choosing an RF amplifier, more consideration may be given to the efficiency of the RF amplifier while still satisfying the requirements of the MRI with respect to linearity. For example, when RF amplifiers of Category AB are adopted, although highly efficient RF amplifiers may cause non-linearity, after carrying out linearity compensation, as in embodiments of the present invention, the RF transmit system can control the non-linearity of the entire RF transmit chain to be within an acceptable range, thereby achieving a linearity requirement of the above noted MRI.

Optionally, the RF transmit system 100 according to an illustrative embodiment of the present invention further comprises a memory 125 and a processor 127. For example, the memory 125 and the processor 127 may be disposed in the RF output unit 120, as shown in FIG. 3. The memory 125 is used to store the feedback signal-linearity compensation value-relationship described above, for example, the memory 125 may store one or more lookup tables representing the above relationship. The processor 127 is used to look for a linearity compensation value from a determined lookup table according to the forward feedback signal as described above, and to generate a corresponding linearity compensation control signal. Processor 127 is also used to determine a look-up table to look for such linearity compensation values according to the reverse feedback signal as described above. Of course, the memory 125 and the processor 127 may also be disposed separately outside of the RF output unit 120, or even disposed separately outside of the RF transmit system 100.

Processor 125 may also be used to store computer programs that may be read by processor 127 to execute RF transmit methods, which will be described below in corporation with specific embodiments.

The above feedback signal-linearity compensation value-relationship may be pre-stored in memory 125, or re-generated at the scan site. This relationship can be generated in a historical scan application of the MRI system, or can be a lookup table obtained under a specific load through other routes.

As shown in FIG. 1 and FIG. 2, the above noted feedback signal outputted from the signal processing unit 140 may comprise a forward feedback signal communicated by the signal processing unit 140 to the RF transmit coil 1020. The feedback signal-linearity compensation value-relationship stored in the form of a lookup table may specifically comprise at least one correspondence respectively between the forward feedback signal and the gain linearity compensation value and phase linearity compensation value, and the RF output unit 120 generates the linearity compensation control signal based on the relationship between the predetermined forward feedback signal and the linearity compensation value.

Figure 4:
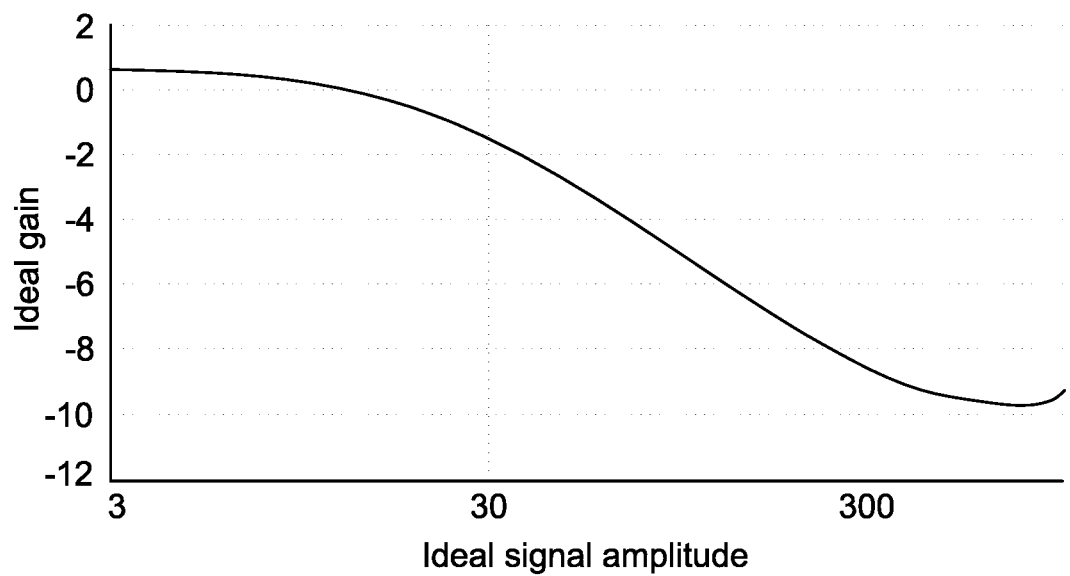
FIG. 4 illustrates gain characteristics with an ideal signal amplitude.
Figure 5:
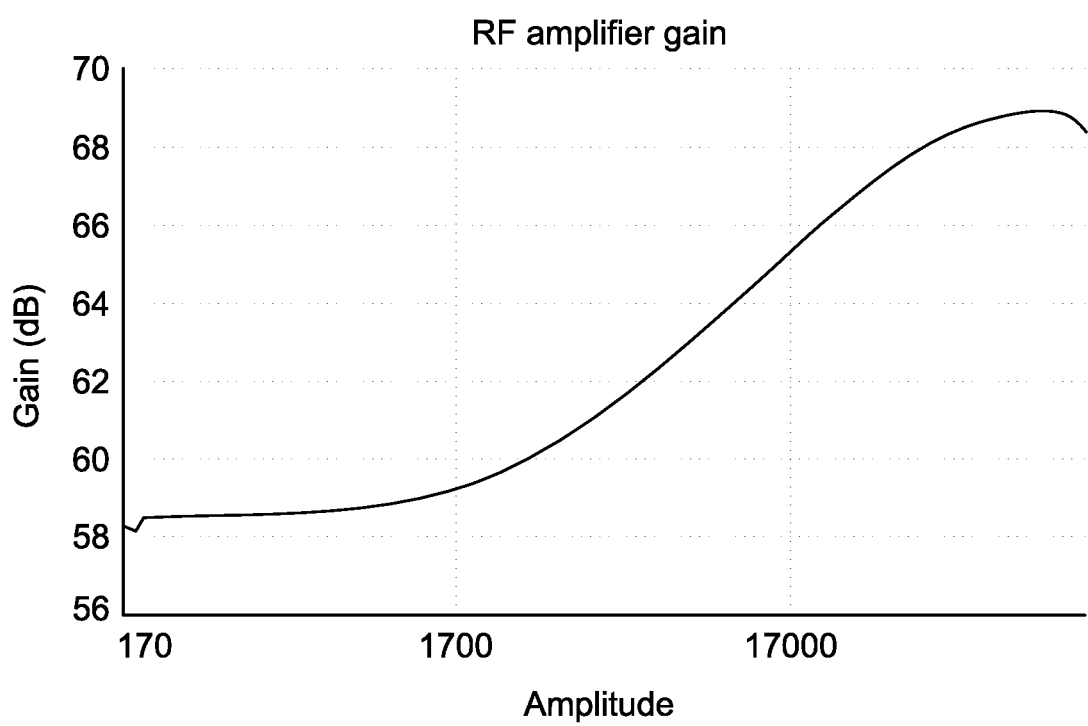
FIG. 5 illustrates a compensation curve for the gain characteristics as shown in FIG. 4.

FIG. 4 illustrates the gain (Y-ordinate) characteristics at the ideal signal amplitude (X-coordinate). FIG. 5 illustrates a compensation curve for the gain characteristics shown in FIG. 4. When compensation for a gain at a certain amplitude to a reference gain is required, such compensation may be carried out according to a gain value (compensation value) at the corresponding amplitude in FIG. 5 when carrying out such compensation, so as to reach a reference value through carrying out necessary calculation with such compensation value and the gain in FIG. 4 (there is no specific limit to such calculation and selections and adjustments may be made according to the actual situation). The linearity compensation values in the above lookup table can be obtained based on principles similar to such compensation.

Figure 6:
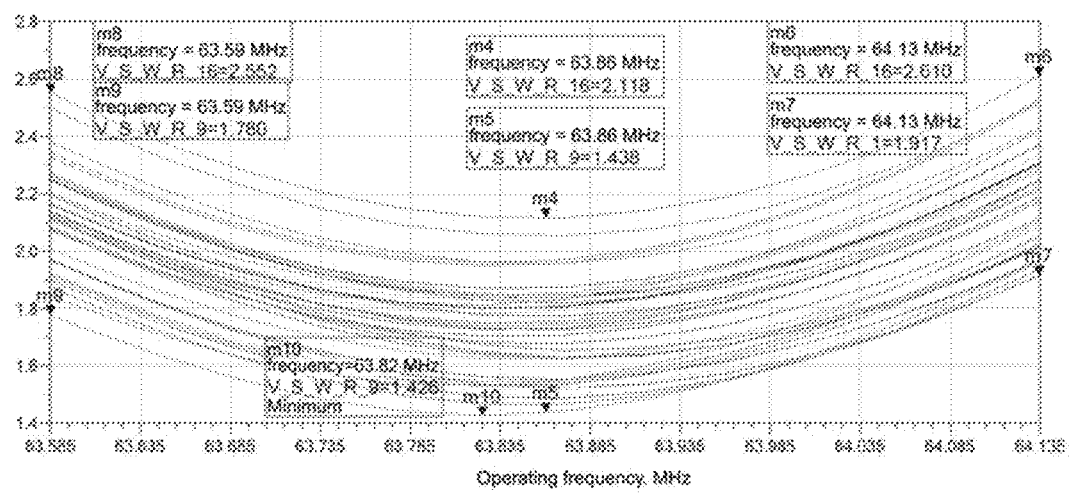
FIG. 6 illustrates a curve of voltage standing wave ratios of different human bodies.

Further, in order to better meet the linearity requirements of MRI, the feedback signal-linearity compensation value-relationship obtained under the load of the actual object to be scanned may be used for the linearity compensation according to the RF transmit system 100 of the present invention, taking into consideration the variation of the load with respect to the entire transmit chain or even the MRI system. The curve in FIG. 6 illustrates voltage standing wave ratios (VSWR) of different human bodies, where the X-coordinate represents a working frequency and the Y-coordinate represents the VSWR. The VSWR is a ratio of the antinode voltage of the standing wave to the trough voltage amplitude and when VSWR is equal to 1, it means the resistances of the feeder line and the antenna are a complete match and at this point, the high frequency energy is completely radiated out by the antenna and there is no reflection loss of the energy. Under an ideal load of 50 Ohm that is normally used, the VSWR is equal to 1; however, under many circumstances, the human body part to be scanned can never always be a 50 Ohm load and thus the VSWR cannot be equal to 1.

Figure 7:
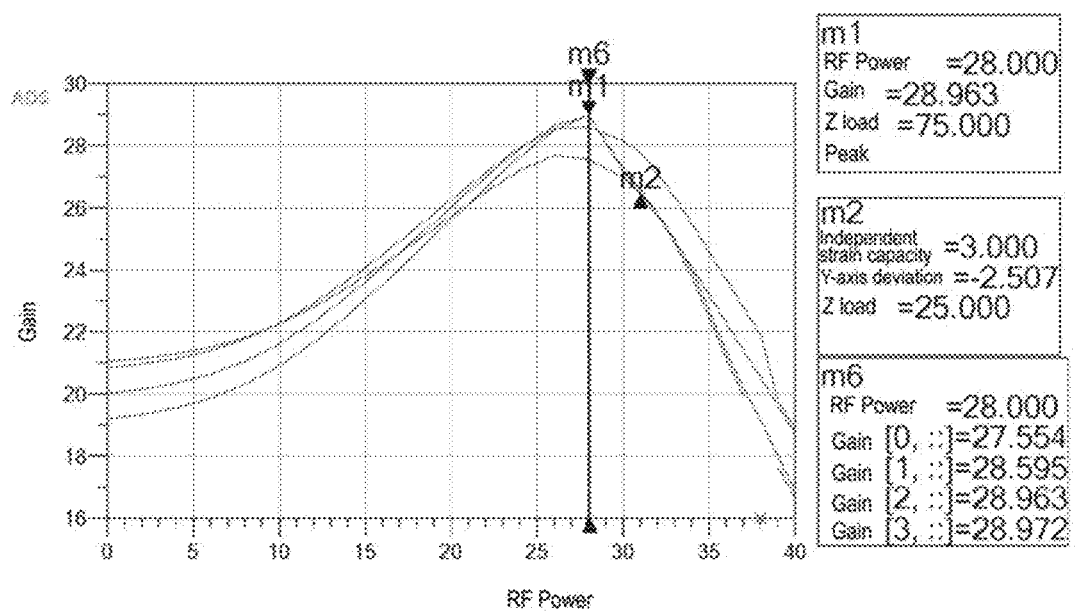
FIG. 7 illustrates a relationship between the power of an RF and a gain.

The impact of load variations on gain is also very high. Referring to FIG. 7, the curve therein illustrates the relationship between gain variation and resistance load in a 40 dB dynamic range, wherein the X-coordinate is the RF power and the Y-coordinate illustrates that the gain deviation is −2.507 when the gain load resistance changes from 75 Ohm to 25 Ohm. For the gain variation in the figure, the effect of phase has not been taken into account. In practice, however, the phase will change and the gain will also be affected and thus, the gain variation in practice will be greater.

The significant impact of load variations is apparent based on the above analysis. In the conventional technique, for example, it is difficult for the method of carrying out linearity compensation with respect to the RF amplifier based on a fixed load to be applied in the RF transmit chain of the MRI system. Load variations happen because each scan in the MRI system may be for different patients. The conventional compensation method may even cause decoupling between the body coil and the surface coil, which is very undesirable.

In one aspect, according to an embodiment of the present invention, the feedback signal-linearity compensation value-relationship may comprise a relationship between a plurality of groups of feedback signals corresponding to different load characteristics and the linearity compensation values. In other words, for example, a plurality or all items in the stored look-up tables may respectively be associated with different load characteristics (or types of objects to be scanned). That is, these lookup tables may be grouped according to corresponding load characteristics. The load may be, for example, the object to be scanned as described above. The load characteristic may be, for example, an attribute or a type of the object to be scanned, which may include the age, gender, body type, body weight, scan site and the like, which cause the object to be scanned to have different resistances. The RF output unit 120 is used to decide the load characteristics of the RF transmit coil 1020 based on the reverse feedback signal and determine a linearity compensation value for the gain and/or phase corresponding to the forward feedback signal in a group of feedback signal-linearity compensation value-relationships corresponding to the determined load characteristics and generate a linearity compensation control signal as described above based on the determined linearity compensation value.

In such a manner, load characteristics may be determined based on the reverse feedback signal. A characteristic value corresponding to the forward feedback signal can be looked up in such group of the lookup tables of such load characteristics (feedback signal-linearity compensation value-relationship). A linearity compensation value corresponding to the found characteristic value is selected, so that a suitable linearity compensation can be carried out through adapting to the real-time update of the load.

On the other hand, according to an embodiment of the present invention, if no such lookup table exists in the stored lookup tables that corresponds to the current load characteristics, then a new lookup table can be generated in real-time and stored and a linearity compensation value can be determined through looking up in the lookup table generated in real time. That is, the RF output unit 120 is also used to pre-generate a relationship between the corresponding feedback signal (e.g., a forward feedback signal) and a linearity compensation value, based on the currently decided load characteristics prior to generating the linearity compensated RF excitation pulse.

Figure 8:
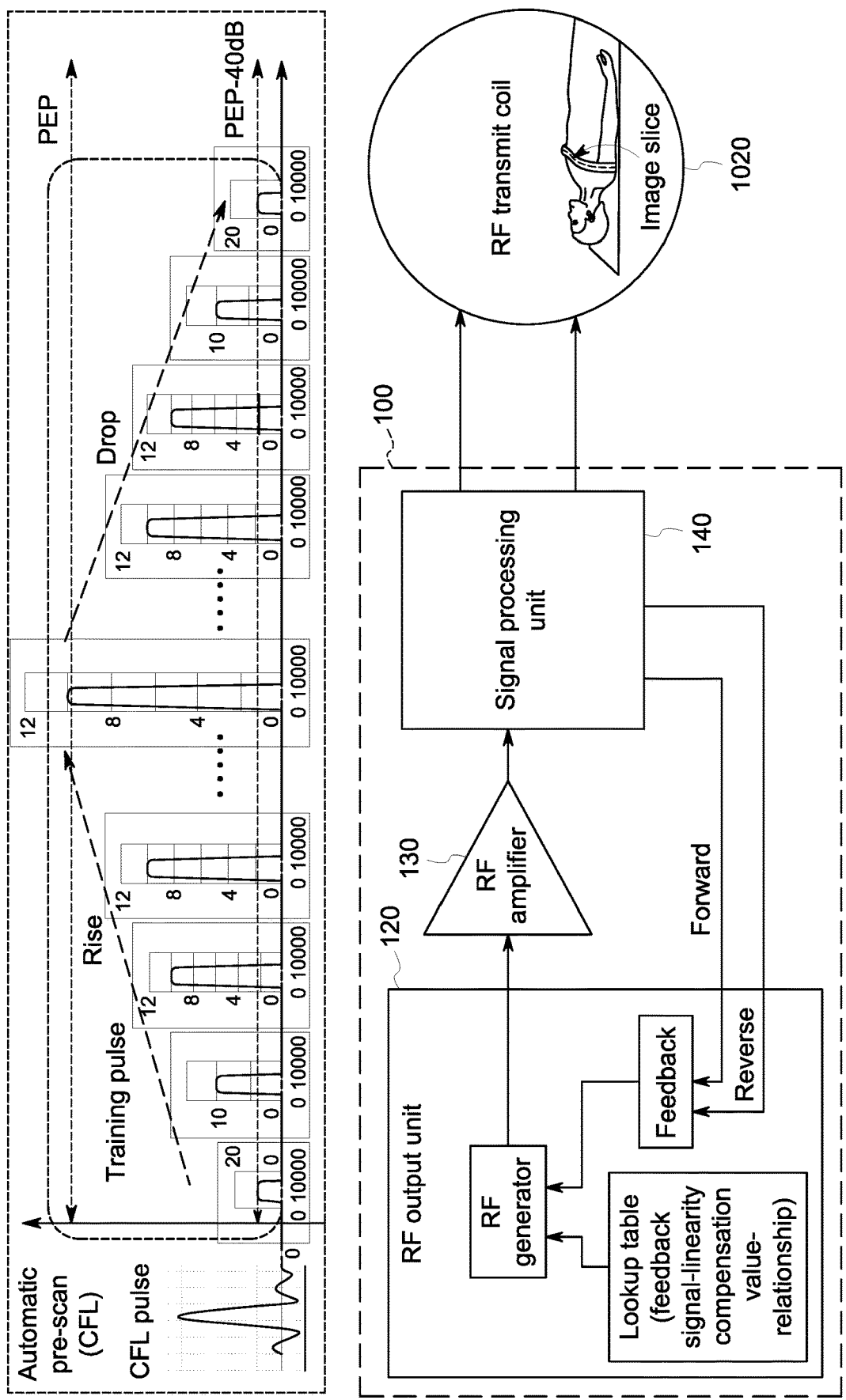
FIG. 8 illustrates a schematic diagram for generating a feedback signal-linearity compensation value-relationship, based on a load of an object to be scanned by an RF transmit system in an illustrative embodiment of the present invention.

FIG. 8 illustrates a schematic diagram for generating a feedback signal-linearity compensation value-relationship of an object to be scanned, based on a load of the object to be scanned, by the RF transmit system 100. Specifically, the RF pulse signal outputted by the RF output unit 120 comprises a group of pulse signals generated according to the preset sequence having a central frequency (e.g., the training pulses $P_1$-$P_n$ in FIG. 8), regardless of whether these are lookup tables generated in real-time or lookup tables in historical data. Such pulse signal has different amplitudes and the above noted central frequency may be a central frequency of the RF excitation pulse adopted when the MRI system carries out scanning with respect to the current load.

For example, firstly, the RF output unit 120 generates a group of training pulse $P_1$-$P_n$ and the group of training pulses are amplified by the RF amplifier 130 and then outputted to the signal processing unit 140. The signal processing unit 140 correspondingly outputs a group of forward feedback signals. At the meantime, after the amplified training pulses $P_1$-$P_n$ are communicated to the RF transmit coil 1020, another group of feedback signals from the RF transmit coil 1020 return to the signal processing unit 140, and are outputted by the signal processing unit 140, i.e., the reverse feedback signals. The open-loop characteristics under the load of the current object to scanned of the RF output unit 120 and RF amplifier 130 are calculated, based on such forward feedback signals. After that, a lookup table that can represent the relationship between the signal characteristic value and the linearity compensation value (hereinafter referred to as the "lookup table") may be generated according to such open-loop characteristics.

The process described above may be completed during a pre-scan process of MRI. In such stage, the RF output unit 120, RF amplifier 130, and signal processing unit 140 constitute an open-loop circuit. The open-loop characteristics of the RF output unit 120 and RF amplifier 130 under the load of the current object to be scanned may be calculated based on the forward feedback signal outputted by the signal processing unit 140. The open-loop characteristic may be a voltage, current, or power, although in practice, the open-loop characteristic is normally the power.

The lookup table described above is generated under the load of the current object to be scanned, so that such a lookup table can be used to reliably carry out linearity compensation in subsequent formal scans, which may be more suitably applied to the application of MRI systems compared with those linearity compensation methods in the prior art designed with fixed load. Further, as previously described, the open-loop characteristics of the RF output unit 120 and RF amplifier 130, on which the above noted lookup table is based, are under the load of the object to be scanned; in other words, it is the open-loop characteristics of the RF output unit 120 and RF amplifier 130 under the load of the current object to be scanned; therefore, the linearity compensation carried out at last not only covers the RF amplifier, but also covers the entire transmit chain, including the various parts of the RF input unit 120 and so on.

Referring back to FIG. 8, as shown in the upper portion of the figure, for the group of training pulses $P_1$-$P_n$ generated by the RF output unit 120, for example, the amplitude variation may be selected as being greater than 40 dB and the phase thereof is maintained as constant.

It should be noted that, for the above training pulses $P_1$-$P_n$, regardless of rise or drop, they all need to avoid the impact of a junction temperature. This can be accomplished by setting the pulse width of the training pulse. In particular, the pulse width may be set sufficiently narrow (the pulse width is specifically determined depending on the thermal resistance constant of the power amplification tube), thus avoiding heating due to the application of the pulse.

In addition, the risk of electromagnetic wave absorption ratio (SAR) protection can also be avoided or reduced at the same time through the configuration of the pulse width as described above.

As previously described, the process of generating a new lookup table based on the load of the current object to be scanned can be completed in pre-scan; in particular, the lookup table can be generated during the calibration process of the central frequency.

During an MRI process, the RF excitation pulses can excite protons in the body of the object to be scanned to generate resonance and when the precession frequency of the protons is the same as the central frequency of the RF excitation pulse, energy exchange may be carried out, i.e., a nuclear magnetic resonance, occurs. Thus, the central frequency of the RF excitation pulse is a very sensitive parameter in MRI. If the central frequency is not accurate, it will directly cause the resulting MRI image to be offset; therefore, the calibration of the central frequency is typically achieved by a pre-scan to determine the optimal resonant frequency (central frequency).

The above noted calibration of the central frequency firstly comprises a central frequency lookup (CFL), so that the central frequency is the same as that of the protons in the object to be scanned. Optionally, a lookup table may be generated, based on the load of the current object to be scanned, after the central frequency lookup is completed. That is, after looking up the central frequency, a group of training pulses $P_1$-$P_n$ having such central frequency are generated by the RF output unit 120 and the group of training pulses $P_1$-$P_n$ are amplified by the RF amplifier 130 then outputted to the signal processing unit 140; the signal processing unit 140 correspondingly outputs a group of forward feedback signals and reverse feedback signals; the open-loop characteristics under the load of the current object to be scanned of the RF output unit 120 and RF amplifier 130 are calculated based on such forward feedback signals; and then a new lookup table is generated according to such open-loop characteristics. The above noted training pulses $P_1$-$P_n$ that have been looked up have the central frequency, so that the characteristic values in the ultimately obtained lookup table are closer or consistent with the signal values that are fed from the signal processing unit 140 when the MRI subsequently executes a scan process and thus, undoubtedly the linearity compensation value selected from such lookup table can better carry out linearity compensation with respect to an output of the RF output unit 120.

The relationship between the generated feedback signal and the linearity compensation value as described above or the lookup table (hereinafter generally referred to as the "lookup table") may be stored on the above noted memory 125 according to requirements and the actual situation, or not stored, after the completion of this round of scan.

If no lookup table is stored in the memory, then a lookup table is generated based on the load of the current object to be scanned as described above in the current scanning process.

The stored lookup table is recorded at the same time with the corresponding load. When the next scan is carried out, the load of the current object to be scanned may be compared with the load corresponding to the lookup table stored in the memory. If the stored lookup table corresponds to the load of the current object to be scanned, then the RF output unit 120 directly utilizes such corresponding lookup table; if not, then in the pre-scan process, a new lookup table is generated based on the load of the current object to be scanned.

In practice, the load corresponding to the lookup table described above may, for example, be recorded as including the scan site and body weight of the object to be scanned. The above noted "corresponding to the load characteristics or corresponding to the load" not only comprises the case where the scan site and the body weight are completely the same, but also the case where the scan sites are similar and/or the body weights are similar. For example, what is stored is the "back of hand" and currently what is to be scanned is the "palm." For example, the stored weight is "50 kg" and the body weight of the object to be scanned is "50.5 kg." A specific deviation may be set based on the actual requirements, which may be considered to be "corresponding to the load characteristics or corresponding to the load," as long as the preset "similarity" condition is met. For some specialized hospitals, such as children's hospitals, infants/children of different age groups also have their corresponding values or ranges. Therefore, the load corresponding to the lookup table may also be recorded as the scan site and age and thus, the purpose can be achieved only through checking whether the scan site and the age are the same or similar. Even if there were specialized pediatric departments that are distinguished by age, the load corresponding to the lookup table can also be recorded only as a scan site, and thus, the purpose can be achieved only through checking whether the scan sites are the same or similar.

For some specialized hospitals, for example, the children's hospital or orthopedic hospital, as previously mentioned, as the ailment site to be scanned is relatively special, the lookup table corresponding to the load of these special ailment sites may be pre-stored in the memory and specifically the lookup table corresponding to the load of the concerned ailment sites may be pre-stored according the clinical experiences of the doctor or the ratio of the actual cases. When storing these lookup tables, their corresponding loads are also recorded, i.e., the ailment site and the weight of the patient (or age) and so on.

As an example, for some general hospitals, priority lookup tables for recommendation may be determined according to the current load characteristics and based on a deep learning network. For example, the fact, as to which lookup tables corresponding to certain scan sites should be stored as a priority, is at least determined; or, the fact, as to which stored lookup tables corresponding to certain scan sites should be ordered as a priority, is determined, so as to save the lookup time. In particular, those scanned cases may be used as the input sample, the scan site is used as the output sample to carry out deep learning, so as to obtain—for example—those scan sites with a proportion that is queued in the first twenty positions and the lookup tables corresponding to these scan sites are pre-stored (the weight and/or age may be recorded at the same time, or the corresponding lookup tables may be subdivided according to the weight and/or age). Once the scan sites with a proportion queued in the first twenty positions in the actual cases have changed, the lookup table corresponding to the new scan sites queued in the first twenty positions is used to replace the old stored data, so that the stored lookup tables are always those used most in ailment scans in such hospital, thereby better suiting clinical applications; or the order of the corresponding lookup tables is updated according to the updated order of the scan sites.

For another example, lookup tables that match or largely match with such load characteristics may be directly determined with respect to the current load characteristics based on a deep learning network and a recommendation can be made. In particular, with the load characteristics as input samples and the lookup tables as the output samples, a deep learning network can be established. Once the current load characteristics (e.g., in one embodiment, these may be determined in the scan parameters configured when carrying out MRI scan) have been input into such deep learning network, the lookup tables that match with these may be determined. A quick linearity compensation may be executed through further looking for the index (e.g., the power, or the other characteristic values that can represent the power) corresponding to the forward feedback signal in the lookup table.

Figure 9:
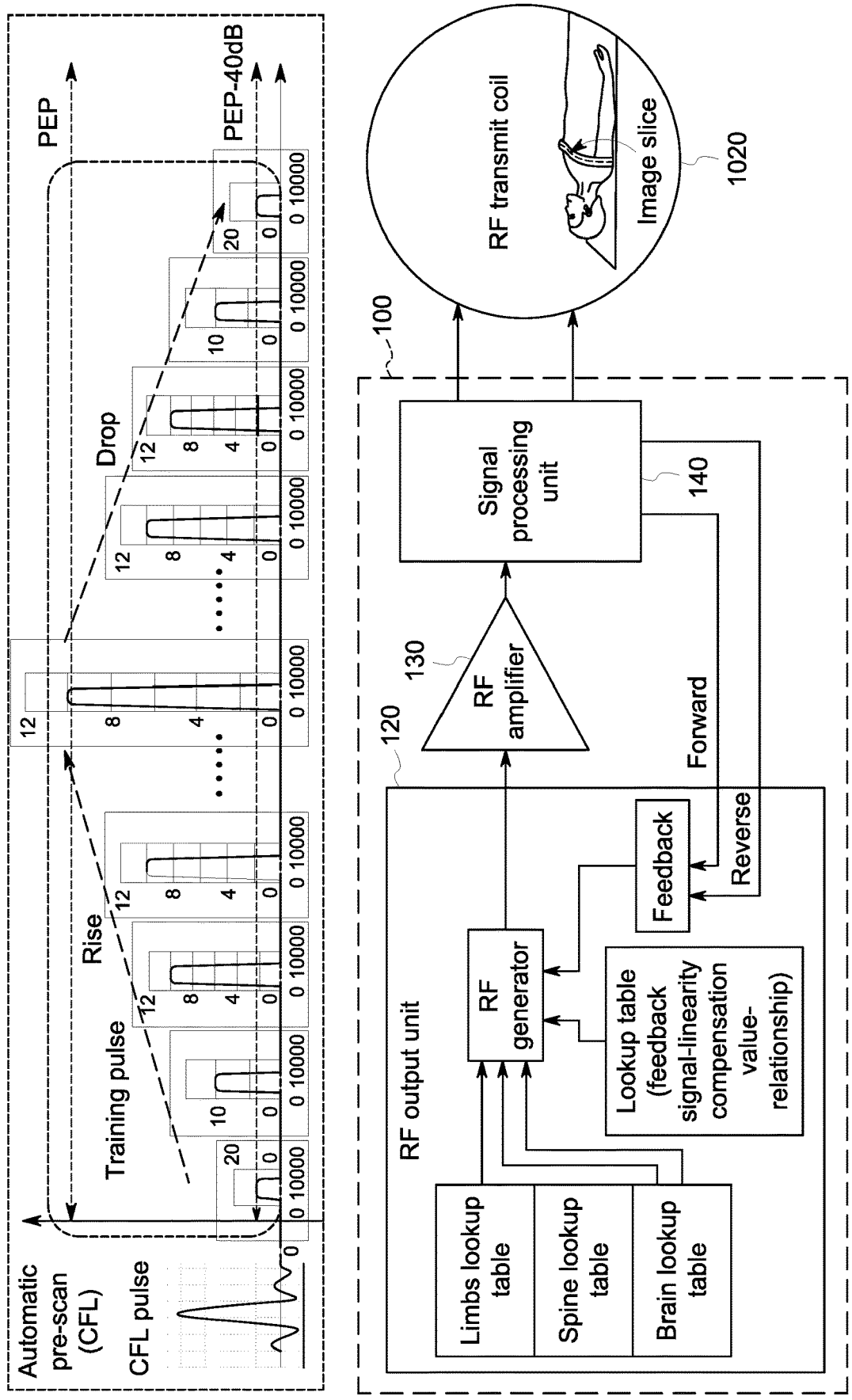
FIG. 9 illustrates an RF transmit system stored with some lookup tables corresponding to loads of specific ailment parts according to an illustrative embodiment of the present invention.

Some lookup tables corresponding to the loads of specific ailment sites are pre-stored in the RF transmit system as shown in FIG. 9. Each time after a new lookup table is obtained, the current scan site to be scanned is compared with the scan sites corresponding to the pre-stored in these lookup tables, before carrying out a formal scan with respect to the object to be scanned and if they are the same (or exhibits a similarity that is within an acceptable range), then the weight (or age and so on) of the patient to be scanned is compared, thereby determining whether any pre-stored lookup table corresponding to the load of the current sites to be scanned exists. If a corresponding lookup table exists, the step of generating a new lookup table based on the load of the current object to be scanned may be skipped and linearity compensation may be carried out directly with the corresponding lookup table in the formal scan, thereby saving the time required for the scan and greatly increasing the efficiency of the work, while ensuring the linearity compensation still has relatively good effect.

Second Embodiment

According to an embodiment of the present invention, an MRI system is further provided.

Figure 10:
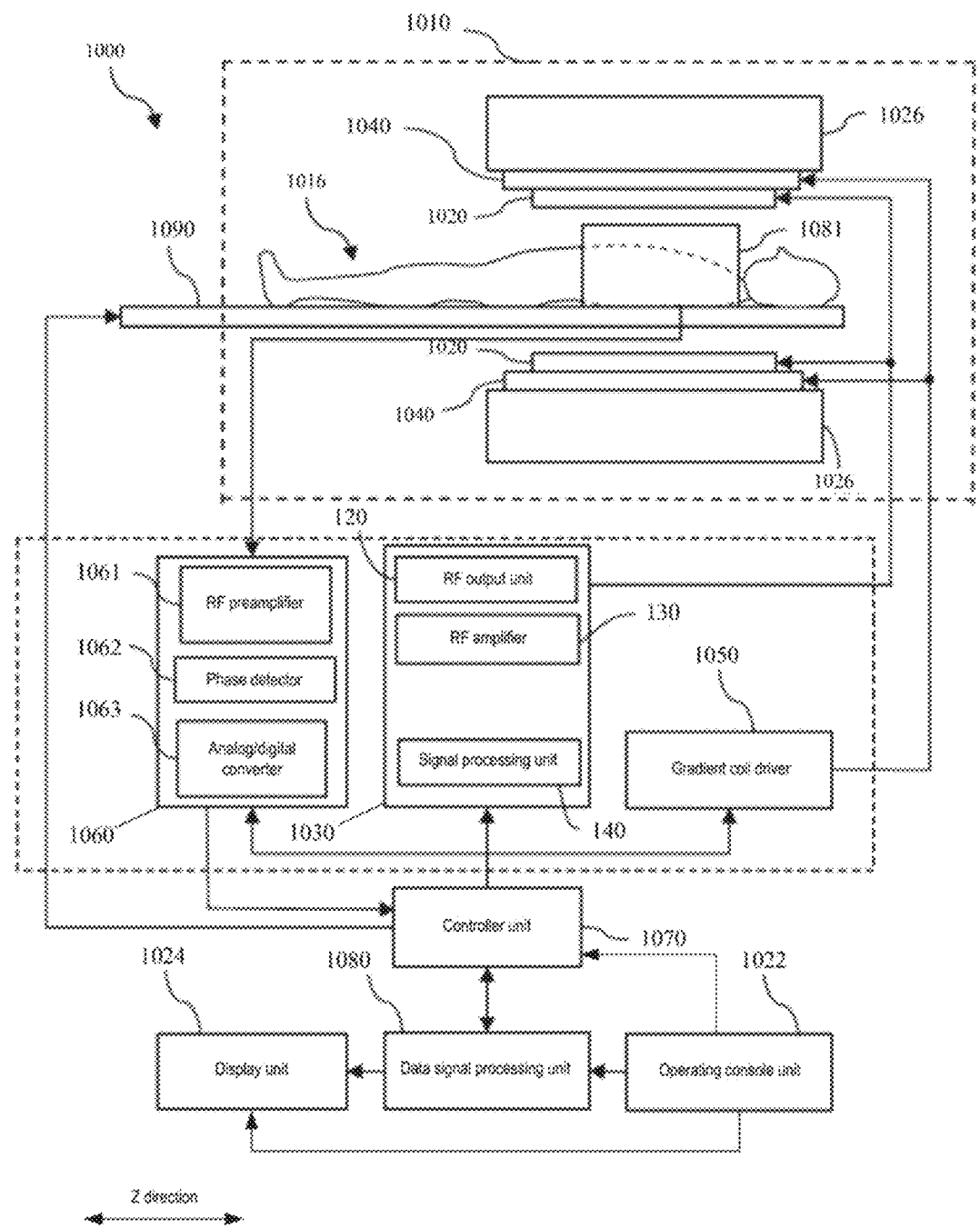
FIG. 10 illustrates a schematic block diagram of an MRI system according to an illustrative embodiment of the present invention.

FIG. 10 illustrates a schematic block diagram of an MRI system according to an embodiment of the present invention. As shown in FIG. 10, the MRI System 1000 comprises: a primary magnet assembly 1010, (the above noted) RF transmit coil 1020, an RF transmit subsystem 1030, a gradient coil assembly 1040, a gradient coil driver 1050, an RF receiving subsystem 1060, a controller unit 1070, a data signal processing unit 1080 and a scanning bed 1090.

The primary magnet assembly 1010 typically comprises, for example: a superconducting magnet 1026. A primary magnet coil is disposed along the circumference of such superconducting magnet. Such superconducting magnet is installed inside an annular vacuum vessel, and an imaging space of a cylindrical shape that surround the object to be scanned 1016 is defined. A constant static magnetic field, such as a static magnetic field B0, is generated along a Z direction of the imaging space. The MRI system 1000 utilizes the formed static magnetic field B0 to transmit a magnetostatic pulse signal to the object to be scanned 1016 that is placed in the imaging space, so that the precession of protons in the body of the object to be scanned 1016 is ordered, so as to generate a vertical magnetization vector.

The RF transmit coil 1020 is typically disposed along an inner ring of the primary magnet and is used to transit a radio frequency B1, which is orthogonal to the static magnetic field B0, to the object to be scanned 1016, so as to excite the atomic nucleus in the body of the object to be scanned 1016 in response to the RF excitation pulse transmitted from the RF transmit subsystem 1030. As a result, the vertical magnetization vector is transformed into a horizontal magnetization vector.

The RF transmit subsystem 1030 may be any of the RF transmit systems as described in the first embodiment for transmitting RF pulse signals such as RF excitation pulses to the RF transmit coil 1020 in response to a pulse sequence control signal transmitted by the controller unit 1070. Specifically, the controller unit 1070 can generate a pulse sequence through, for example, a pulse sequence generator; and the RF transmit subsystem 1030 generates RF pulse signals based on the RF pulses in the pulse sequence transmitted by the pulse sequence generator and processes the RF pulse signals. The RF pulses may be outputted by the RF output unit 120 in the RF transmit subsystem 1030, amplified by the RF amplifier 130, and communicated by the signal processing unit 140 to the RF transmit coil 1020.

After the completion of the radio-frequency excitation pulses, a free induction decay signal, i.e., a magnetic resonance signal that can be acquired, is generated in the process that the horizontal magnetization vector of the object to be scanned 1016 is gradually restored to zero.

Radio-frequency pulses may further comprise pulses of other functions, such as the training pulses $P_1$-$P_n$ as described above.

In one embodiment, the switch for switching between a transmit mode and a receiving mode in the RF signal processing unit 140 of the RF transmit subsystem 1030 may switch the RF transmit coil 1020 between the transmit mode and receiving mode, where in the receiving mode, the RF transmit coil 1020 may be used to receive a magnetic resonance signal from the object to be scanned 1016, which may also be acquired through the RF receiving coil 1081 disposed close to the object to be scanned 1016.

The gradient coil assembly 1040 typically comprises three groups of gradient coils disposed along the X-axis, the Y-axis and the Z-axis, respectively, for receiving a power driving signal generated from the gradient coil driver 1050, so as to generated a three-dimensional gradient magnetic field in the imaging space and to carry out three-dimensional coding with respect to the magnetic resonance signal as described above, i.e., providing three-dimensional position information of the magnetic resonance signal as described above.

Based on the magnetic resonance signal through three-dimensional coding, a medical image of a scan site of the object to be scanned may be reconstructed, which will be described below.

The RF receiving subsystem 1060 is used to receive a magnetic resonance signal acquired by the RF receiving coil 1081 or the RF transmit coil 1020 in a receiving mode. Specifically, the RF receiving subsystem 1060 may comprise a preamplifier 1061, a phase detector 1062, and an analog/digital converter 1063. The RF preamplifier 1061 is used for amplifying the magnetic resonance signal received by the RF receiving coil 1081 or the RF transmit coil 1020. The phase detector 1062 is used for executing phase detection with respect to the amplified magnetic resonance signal. The analog/digital converter 1063 is used for converting the phase-detected magnetic resonance signal from an analog signal to a digital signal and then transmitting to the data signal processing unit 1080.

The data signal processing unit 1080 may carry out operations such as pre-processing, reconstructing and so on with respect to the received digitized magnetic resonance signal to obtain the desired image or image data. The data processing unit 1080 may comprise a computer and a storage medium, where a program for predetermined data processing to be executed by the computer is recorded on the storage medium. The data processing unit 1080 may be connected to the controller unit 1070 and execute data processing based on the control signal received from the controller unit 1070.

The controller unit 1070 may comprise a computer and a storage medium for storing a program executable by a computer that, when executed by a computer, may cause the various parts of the MRI system 1000 to implement the corresponding operations, so as to execute the scan process for the object to be scanned 1016 and such scan process may further comprise a pre-scan and a formal scan after the pre-scan.

For example, the controller unit 1070 may control the MRI system 1000 to carry out pre-scan according to a predetermined pulse sequence, which may relate to (but not limited to) controlling an amplitude, a power, a flip angle, a frequency and so on of an RF pulse signal transmitted by an RF transmit subsystem 1030. The control may relate to (but not limited to) controlling the power of a driving signal sent from the gradient coil driver 1050 and controlling the density of the magnetic resonance signal acquired by the RF receiving subsystem 1060 and so on.

Although it has been described in the first embodiment that the memory 125 disposed in the RF output unit 120 may store the above noted relationships between the feedback signal and the gain and/or phase and a computer program relating to an RF excitation method, it should be appreciated that such relationships and/or program may also be stored in the memory of the computer of the controller unit 1070. Although it has been described in the first embodiment that the processor 127 disposed in the RF output unit 120 is used to execute the above noted RF excitation method, for example, accessing the lookup table to look for the forward linearity compensation value corresponding to the feedback signal and generate the corresponding linearity compensation control signal, it should be appreciated that the processor in the computer of the controller unit 1070 can also be used to read and execute the program relating to the above method.

The MRI system 1000 may further comprise an operating console 1022 connected to the controller unit 1070 and the operating console 1022 may comprise a user input device, such as a keyboard and a mouse, where an operator may input an operating signal/control signal to the controller unit 1070 through the user input device. For example, a user may send a preset scan parameter to the controller unit 1070 via the input device of the operating console 1022, which may comprise a determined scan site of the object to be scanned and the other attribute features, such as the load characteristics as described in the first embodiment.

The controller unit 1070 controls the MRI System 1000 to execute image scan based on received operating signals.

The MRI system 1000 may further comprise a display unit 1024. The display unit 1024 may be connected to the operating console 1022 to display an operation interface and may further be connected to the data signal processing unit 1080 to display the image.

The storage media of the controller unit 1070 and the data signal processing unit 1080 as well as the above noted memory 125 may comprise, for example, a ROM, a floppy disk, a hard disk, an optical disk, a magneto-optical disk, a CD-ROM, or a non-volatile memory card and so on.

The MRI system of an embodiment of the present invention comprises the RF transmit system of the first embodiment that can be used to carry out linearity compensation with respect to the transmit chain before the MRI system executes a pre-scan or formal scan, so as to be able to at least generate linearity compensated RF excitation pulses, which are applied to the RF transmit coil when carrying out the pre-scan or formal scan, so as to avoid the decrease of image quality caused by the linearity problem of the transmit chain.

In addition, the MRI system according to an embodiment of the present invention can ensure fidelity even in the event of a load change, so as to obtain a better image quality.

Third Embodiment

According to an embodiment of the present invention, an RF transmit method used for an MRI system is further provided.

Figure 11:
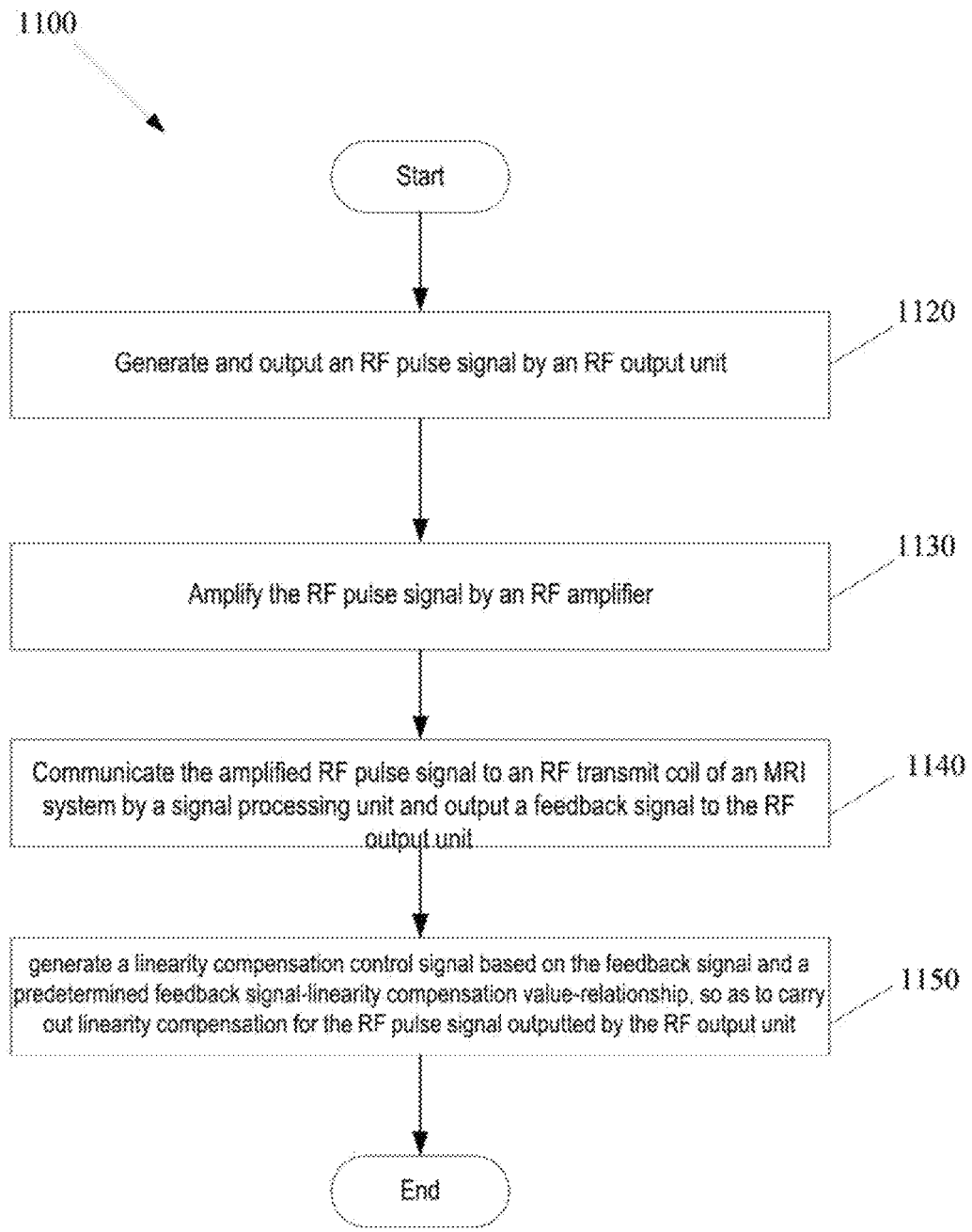
FIGS. 11 and 12 are flowcharts of an RF transmit method for an MRI system according to an illustrative embodiment of the present invention.

Referring to FIG. 11, it illustrates a flowchart 1100 of an RF transmit method for an MRI system according to the third embodiment of the present invention.

In Step S1120, an RF pulse signal is generated and outputted by an RF output unit.

In Step S1130, the RF pulse signal is amplified by the RF amplifier.

In Step S1140, the amplified RF pulse signal is communicated to an RF transmit coil of an MRI system by a signal processing unit and a feedback signal is outputted to the RF output unit.

In Step S1150, a linearity compensation control signal is generated based on the feedback signal and a predetermined feedback signal-linearity compensation relationship (i.e., the correspondence between the feedback signal and a linearity compensation value), so as to carry out linearity compensation for the RF pulse signal outputted by the RF output unit.

Figure 12:
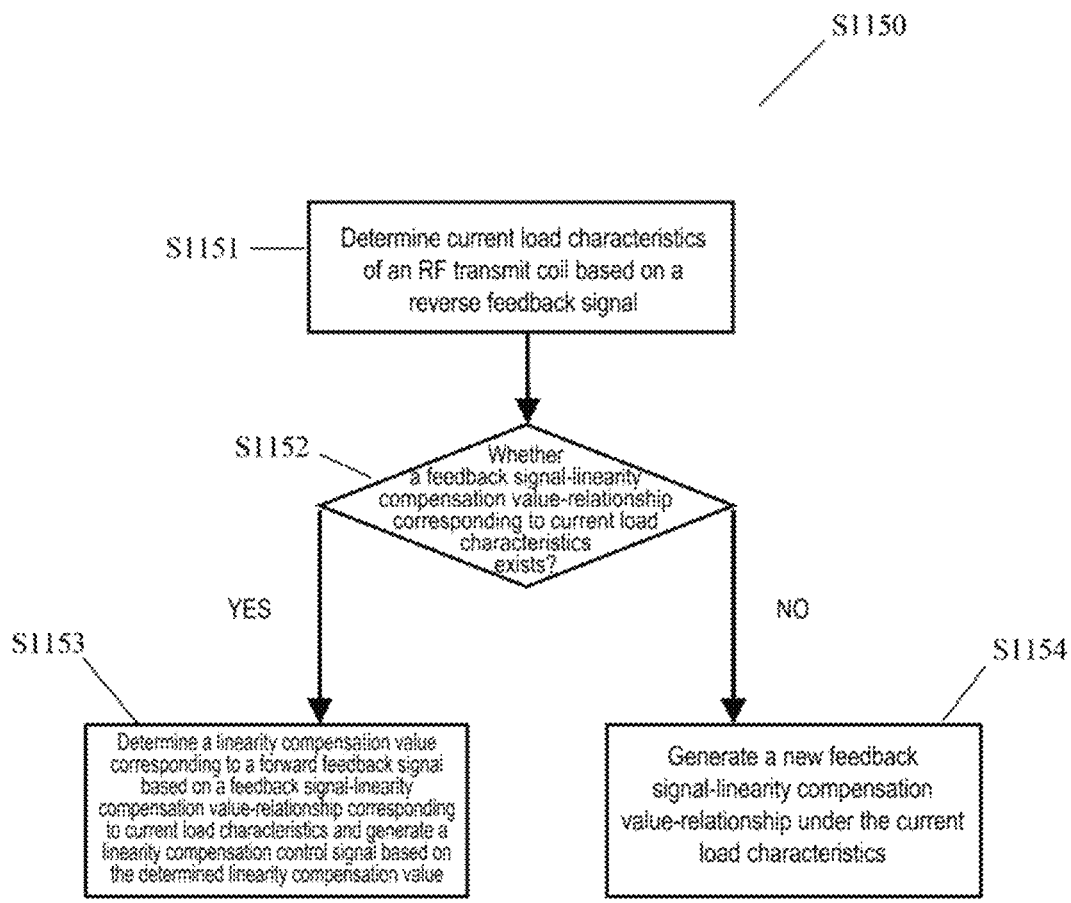

Further, as shown in FIG. 12, the above noted Step S1150 may further comprise Sub-steps S1151-S1154.

Specifically, the above noted feedback signal comprises a forward feedback signal communicated to the RF transmit coil by the signal processing unit and a reverse feedback signal fed back from the RF transmit coil to the signal processing unit and outputted by such signal processing unit; and the above noted predetermined feedback signal-linearity compensation value-relationship comprises a feedback signal-linearity compensation value-relationship generated under the corresponding load characteristics.

In Step S1151, current load characteristics of the RF transmit coil are determined based on the reverse feedback signal.

In Step S1152, the fact as to whether a feedback signal-linearity compensation value-relationship corresponding to the current load characteristics exists is determined.

If a feedback signal-linearity compensation value-relationship corresponding to the current load characteristics exists, then the method enters into Step S1153, wherein the linearity compensation value corresponding to the forward feedback signal is determined based on the feedback signal-compensation value-relationship corresponding to the current load characteristics and the linearity compensation control signal is generated based on the determined linearity compensation value.

If no feedback signal-linearity compensation value-relationship corresponding to the current load characteristics exists, then the method enters into Step S1154, wherein a new feedback signal-linearity compensation value-relationship is generated under the current load characteristics.

Optionally, in Step S1153, a priority feedback signal-linearity compensation value-relationship for recommendation may be determined, based on a predetermined deep learning network and according to the current load characteristics.

Optionally, the RF pulse signal outputted by the RF output unit comprises a group of pulse signals having a central frequency generated according to a preset sequence; the group of pulse signals have different amplitudes; and the central frequency is a central frequency of an RF excitation pulse adopted when the MRI system carries out scanning with respect to the current load.

Optionally, Step S1154 may further comprise: calculating open-loop characteristics of the RF output unit and the RF amplifier under the current load characteristics, based on the forward feedback signal; and generating a feedback signal-linearity compensation value-relationship corresponding to the current load characteristics, based on the open-loop characteristics.

Optionally, the amplitude variation of the applied group of pulse signals is greater than 40 dB and the phase thereof remains constant.

As previously described, the linearity of the entire transmit chain (including the RF output unit and the RF amplifier) may be very effectively compensated, by carrying out linearity compensation through looking for the linearity compensation value corresponding to the feedback signal based on the feedback signal-linearity compensation value-relationship (e.g., looking through the lookup table reflecting the above noted feedback signal-linearity compensation value-relationship).

Further, regardless of whether the scanned load changes each time, a very precise gain/phase compensation can be executed according to the RF transmit method of the present invention. As the above noted lookup table for linearity compensation always corresponds to the current load (if they do not correspond, a new lookup table is generated based on the current load).

The above noted RF transmit method corresponds to the RF transmit system according to the present invention; and many of the design details suitable for use in the RF transmit system are also applicable to the RF transmit method as described above and the same beneficial technical effects may be obtained, which are not repeated herein.

Fourth Embodiment

Figure 13:
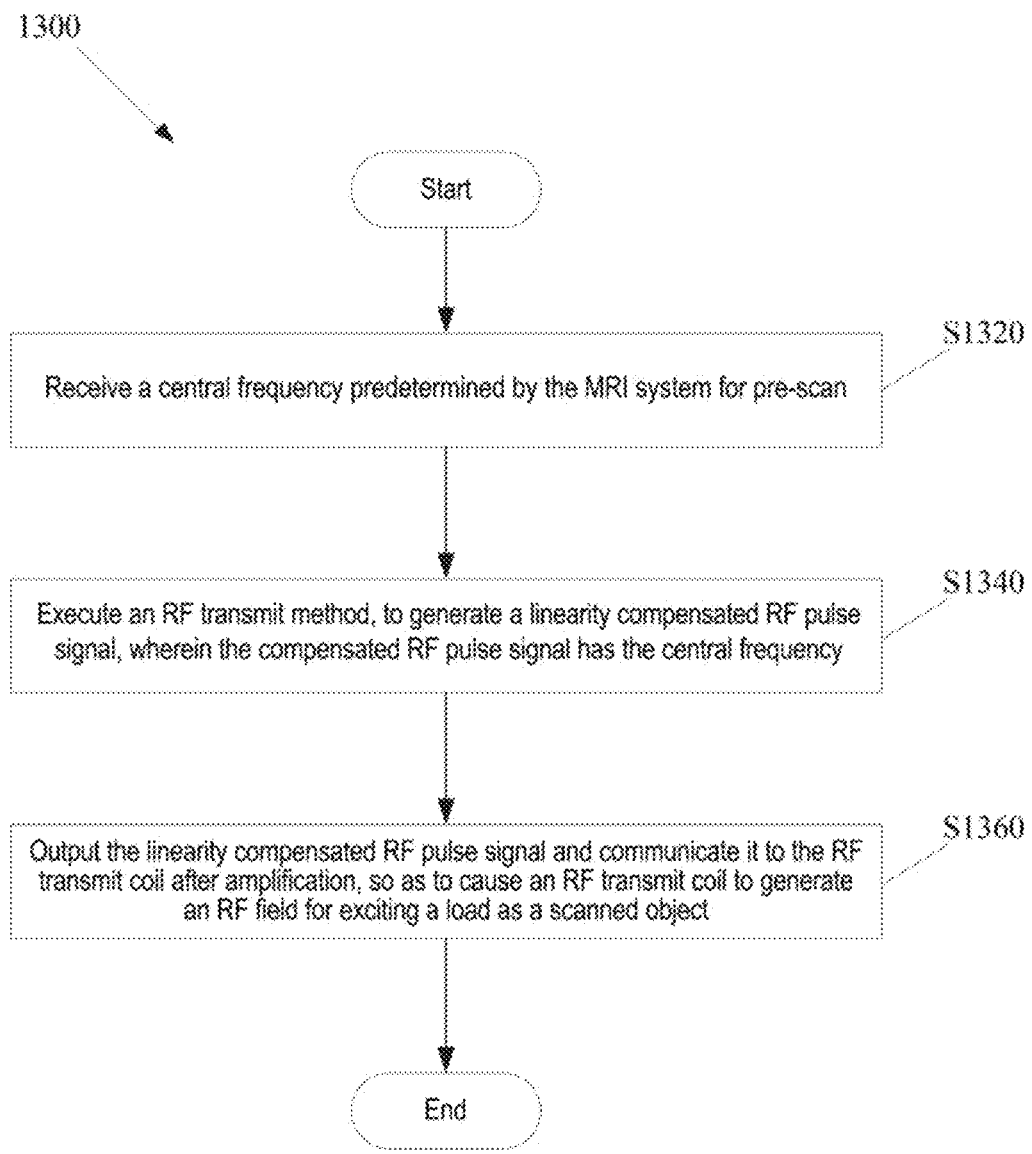
FIG. 13 is a flowchart of a pre-scan method used for an MRI system according to an illustrative embodiment of the present invention.
Figure 14:
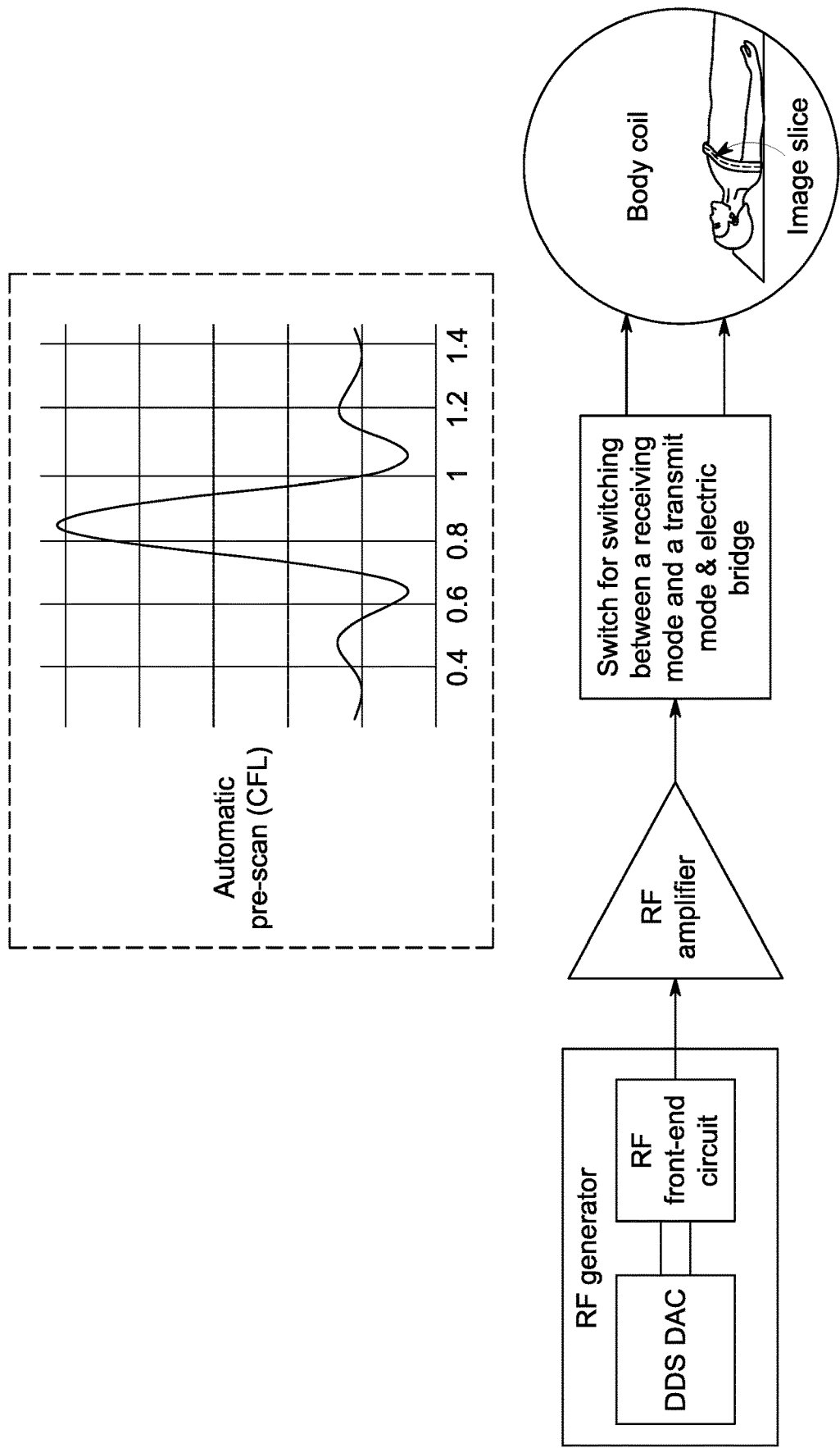
FIG. 14 is a schematic block diagram of a conventional transmit chain configuration in an MRI system.

According to an embodiment of the present invention, a pre-scan method used for an MRI system is further provided. Referring to FIG. 13, a flowchart 1300 of a pre-scan method for an MRI system according to an embodiment of the present invention is illustrated.

In Step S1320, a central frequency for pre-scan predetermined by an MRI system is received;

In Step S1340, the above noted RF transmit method according to the present invention is executed, so as to generate a linearity compensated RF pulse signal, wherein a compensated RF pulse signal has the central frequency.

In Step S1340, the linearity compensated RF pulse signal is outputted and communicated to an RF transmit coil after amplification, so as to cause the RF transmit coil to generate an RF field for exciting a load serving as a scanned object.

An RF transmit method utilizing an embodiment of the present invention to carry out an illustrative method of pre-scan will be described below.

With reference to FIG. 10, scanning settings may be executed after the object to be scanned 1016 enters the scan chamber (i.e., the imaging space defined by the primary magnet); for example, a scan parameter may be set based on the site to be detected, through the operation console 1022. The setting of the scan parameter comprises various settings for scanning parameters such as a scan range, scan protocol and so on.

As previously described, if the central frequency of the RF pulse is not accurate, then it will directly cause the resulting MR image to be offset; and thus, a calibration of the central frequency is typically performed during pre-scan to determine an optimal resonant frequency (central frequency).

A central frequency lookup (CFL) may be performed during calibration of the central frequency. The found central frequency after such lookup is the same as that of the proton in the object to be scanned.

Then, as shown in FIG. 9, a group of pulse signals having such central frequency are generated through the RF output unit 120 and the group of pulse signals are outputted to the signal processing unit 140 after amplifying by the RF amplifier 130. For the group of training pulses generated by the RF output unit 120, the amplitude variation may, for example, be selected as being greater than 40 dB and the phase thereof is maintained as constant. Further, as described above, in the above noted training pulses, regardless of rise or drop, the impact of a junction temperature should be avoided, which may be accomplished by setting the pulse width of the training pulses. Specifically, for example, the pulse width may be set as very narrow depending on the thermal resistance constant of the power amplification tube, thereby preventing heating caused by applying such pulses. Further, the protection of SAR can also be avoided or decreased through setting the pulse widths as described above.

After the RF output unit 120 outputs a group of training pulses, a group of respective forward and reverse feedback signals may be outputted from the signal processing unit 140, each of which may have a signal equal to the number of training pulses, each having its own particular value, e.g., magnitude and/or phase of the power.

Next, based on the reverse feedback signal described above, the scanning site and the other attributes of the object to be scanned, such as the age, body weight, height and so on are determined.

As the forward feedback signals are also affected by load changes, for example, for different scan sites, the characteristics of the forward feedback are also different, i.e., the linearity may vary with the change of the load.

Based on the forward feedback signal under the current load (e.g., including a combination of scanning parameters such as a scan site, age, body weight, etc.) the open-loop characteristics of the RF output unit 120 and the RF amplifier 130 may be calculated under the load of the current object to be scanned.

A lookup table that reflects the feedback signal-linearity compensation value—relationship is generated based on the open-loop characteristics. Specifically, according to the loop-opening characteristics calculated above, the lookup table comprises at least a one-to-one correspondence between the signal characteristic value and the linearity compensation value so that after the pulse signal of each amplitude (at this point, the signal characteristic value is the amplitude of the power) is compensated based on the corresponding linearity compensation value, e.g., maintaining the gain curve of such pulse signals at a relatively high and flat state, i.e., having a higher gain and good linearity. As the feedback signal may generally correspond to the signal characteristic values described above, a one-to-one correspondence between the signal characteristic value and the linearity compensation value may also be considered as a corresponding relationship between the feedback signal and the linearity compensation value (the feedback signal-linearity compensation value-relationship).

As instructions for generating the scan pulse sequence are sent from a controller unit 1070 at the time of pre-scan, the pulses in such sequence comprise, for example, RF excitation pulse and it is desirable that the RF excitation pulse has an ideal amplitude. Therefore, when carrying out linearity compensation, the linearity compensation value under such ideal amplitude is looked up in the feedback signal-linearity compensation value-relationship table (lookup table) under the current load characteristics (already determined based on the reverse feedback signal), thereby maintaining a good linearity of the RF transmit chain during the subsequent pre-scan and scan processes.

If the same scan protocol is also adopted in the next scan, this means that the load characteristics are close or the same and then there is no need to generate a new lookup table again, as the lookup table generated last time can be directly found and a linearity compensation may be carried out through looking up an linearity compensation value corresponding to the ideal signal amplitude therein.

Next, a quick transmit gain algorithm is executed to calculate the transmit gain required for the subsequent formal scans.

Thereafter, an automatic shimming operation is executed to equalize the primary magnetic field of the excitation region.

Finally, the central frequency of the RF pulse signal of the RF output unit 120 is fine-tuned to obtain a maximum signal strength of a current object to be scanned. This step is also part of a central frequency calibration, which may also be further subdivided into a frequency modulation step and a central frequency tuning step.

Once the settings of the scan parameters change, for example, changing to the situation where the next patient is to accept a scan, or a scan at different sites is required, the above noted pre-scan method may be repeated.

According to the pre-scan method of an embodiment of the present invention, the RF output unit executes a linearity compensation for the generated RF pulse signal based on the feedback signal from the signal processing unit and lookup table generated in the pre-scan method. Thus, regardless of whether the current case load has changed, the MRI method adopting the pre-scan method of the present invention can always employ the optimal lookup table for the current case load, to achieve more precise gain and/or phase compensation when compared with the MRI method in the prior art and the fidelity can be ensured, thereby obtaining the optimal image quality, regardless of how the patient load varies.

According to an embodiment of the present invention, a computer-readable storage medium is further provided, having coded instructions recorded thereon and when such instructions are executed, the RF transmit method and pre-scan method as described above can be automatically executed. The computer-readable storage medium may include a hard disk drive, a floppy disk drive, a CD-read/write (CD-R/W) drive, a digital versatile disc (DVD) drive, a flash drive and/or a solid-state storage device. The computer-readable storage medium may be installed in the MRI system, or may be installed in a separate control device or computer that remotely controls the MRI system.

Some exemplary embodiments have been described above. However, it should be understood that various modifications can be made. For example, if the described techniques are performed in a different order and/or if the components of the described system, architecture, device, or circuit are combined in other manners and/or replaced or supplemented with additional components or equivalents thereof, a suitable result can be achieved. Accordingly, other implementation manners also fall within the protection scope of the claims.

The invention claimed is:

1. An RF transmit system of an Mill system, comprising:
 an RF output unit, for generating and outputting an RF pulse signal;
 an RF amplifier, for amplifying the RF pulse signal;
 a signal processing unit, for communicating an amplified RF pulse signal to an RF transmit coil of the MM system and outputting a feedback signal to the RF output unit, wherein
 the RF output unit generates a linearity compensation control signal based on the feedback signal and a predetermined feedback signal-linearity compensation value-relationship, so as to carry out linearity compensation for the RF pulse signal outputted by the RF output unit;
 wherein the feedback signal comprises a forward feedback signal and a reverse feedback signal; and
 wherein the RF output unit is configured to:
  decide current load characteristics of the RF transmit coil based on the reverse feedback signal and determine whether a feedback signal-linearity compensation value-relationship corresponding to the current load characteristics exists;
  generate a new feedback signal-linearity compensation value-relationship under the current load characteristics if no feedback signal-linearity compensation value-relationship corresponding to the current load characteristics exists.

2. The RF transmit system according to claim 1, wherein the forward feedback signal is communicated to the RF transmit coil by the signal processing unit, wherein
 the RF output unit determines a linearity compensation value corresponding to the forward feedback signal based on the predetermined feedback signal-linearity compensation value-relationship and generates the linearity compensation control signal based on the determined linearity compensation value.

3. The RF transmit system according to claim 1, wherein the reverse feedback signal is fed back from the RF transmit coil to the signal processing unit and outputted by such signal processing unit; and wherein the RF output unit is configured to:
 determine a linearity compensation value corresponding to the forward feedback signal based on the feedback signal-linearity compensation value-relationship corresponding to the current load characteristics if a feedback signal-linearity compensation value-relationship corresponding to the current load characteristics exists; and generate the linearity compensation control signal based on the determined linearity compensation value.

4. The RF transmit system according to claim 3, wherein the RF pulse signal outputted by the RF output unit comprises a group of pulse signals having a central frequency generated according to a preset sequence; the group of pulse signals have different amplitudes; and the central frequency is a central frequency of an RF excitation pulse adopted when the MM system carries out scanning with respect to a current load.

5. The RF transmit system according to claim 4, wherein if no feedback signal-linearity compensation value-relationship corresponding to the current load characteristics exists, then the RF output unit is further configured to:
 calculate open-loop characteristics of the RF output unit and the RF amplifier under the current load characteristics based on the forward feedback signal; and
 generate a feedback signal-linearity compensation value-relationship corresponding to the current load characteristics according to the open-loop characteristics.

6. The RF transmit system according to claim 5, wherein the amplitude variation of the applied group of pulse signals is greater than 40 dB and the phase thereof remains constant.

7. The RF transmit system according to claim 3, wherein if a feedback signal-linearity compensation value-relationship corresponding to the current load characteristics exists, then the RF output unit is further configured to:
 determine a priority feedback signal-linearity compensation value-relationship for recommendation, based on a predetermined deep learning network and according to the current load characteristics.

8. The RF transmit system according to claim 1, further comprising a memory, for storing the predetermined feedback signal-linearity compensation value-relationship.

9. An MRI system, comprising:
 an RF transmit coil; and
 the RF transmit system according to claim 1.

10. An RF transmit method for an MRI system, comprising the steps of:
 generating and outputting an RF pulse signal by an RF output unit;
 amplifying the RF pulse signal by an RF amplifier;
 communicating the amplified RF pulse signal to an RF transmit coil of the MM system by a signal processing unit and outputting a feedback signal to the RF output unit;
 generating a linearity compensation control signal based on the feedback signal and a predetermined feedback signal-linearity compensation value-relationship outputted by the RF output unit, so as to carry out linearity compensation for the RF pulse signal outputted by the RF output unit;
 wherein the feedback signal comprises a forward feedback signal and a reverse feedback signal; and the step of generating a linearity compensation control signal further comprises the following the sub-steps:
  deciding current load characteristics of the RF transmit coil based on the reverse feedback signal;
  determining whether a feedback signal-linearity compensation value-relationship corresponding to the current load characteristics exists; and
  generating a new feedback signal-linearity compensation value-relationship under the current load characteristics if no feedback signal-linearity compensation value-relationship corresponding to the current load characteristics exists.

11. The RF transmit method according to claim 10, wherein the forward feedback signal is communicated to the RF transmit coil by the signal processing unit and the reverse feedback signal is fed back from the RF transmit coil to the signal processing unit and outputted by such signal processing unit; and the step of generating a linearity compensation control signal further comprises the following the sub-steps:

determine a linearity compensation value corresponding to the forward feedback signal based on the feedback signal-linearity compensation value-relationship corresponding to the current load characteristics if a feedback signal-linearity compensation value-relationship corresponding to the current load characteristics exists; and generate the linearity compensation control signal based on the determined linearity compensation value.

12. The RF transmit method according to claim 11, wherein the RF pulse signal outputted by the RF output unit comprises a group of pulse signals having a central frequency generated according to a preset sequence; the group of pulse signals have different amplitudes; and the central frequency is a central frequency of an RF excitation pulse adopted when the MRI system carries out scanning with respect to the current load.

13. The RF transmit method according to claim 12, wherein the sub-steps of generating a new feedback signal-linearity compensation value-relationship under the current load characteristics comprises:
calculating open-loop characteristics of the RF output unit and the RF amplifier under the current load characteristics based on the forward feedback signal; and
generate a feedback signal-linearity compensation value-relationship corresponding to the current load characteristics according to the open-loop characteristics.

14. The RF transmit method according to claim 13, wherein the amplitude variation of the applied group of pulse signals is greater than 40 dB and the phase thereof remains constant.

15. The RF transmit method according to claim 11, wherein when a feedback signal-linearity compensation value-relationship corresponding to the current load characteristics exists, the step of generating a linearity compensation control signal further comprises the following sub-step:
determining a priority feedback signal-linearity compensation value-relationship for recommendation, based on a predetermined deep learning network and according to the current load characteristics.

16. A pre-scan method for an MRI system, comprising:
receiving a central frequency for pre-scan predetermined by the MRI system;
executing the RF transmit method according to claim 10, so as to generate a linearity compensated RF pulse signal, wherein the compensated RF pulse signal has the central frequency; and
outputting the linearity compensated RF pulse signal which is then communicated to the RF transmit coil after amplification, so as to cause the RF transmit coil to generate an RF field for exciting a load serving as a scanned object.

17. A non-transitory computer-readable storage medium, having coded instructions recorded thereon and when the instructions are executed, the RF transmit method according to claim 10 is executed.

18. A non-transitory computer-readable storage medium, having coded instructions recorded thereon and when the instructions are executed, the pre-scan method according to claim 16 is executed.

* * * * *